(12) United States Patent
Iwama

(10) Patent No.: US 9,239,438 B2
(45) Date of Patent: Jan. 19, 2016

(54) OPTICAL SEMICONDUCTOR ELEMENT AND METHOD OF MANUFACTURING THE SAME

(71) Applicant: FUJITSU LIMITED, Kawasaki-shi, Kanagawa (JP)

(72) Inventor: Masahiro Iwama, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/490,823

(22) Filed: Sep. 19, 2014

(65) Prior Publication Data

US 2015/0084145 A1 Mar. 26, 2015

(30) Foreign Application Priority Data

Sep. 24, 2013 (JP) ................................. 2013-196774

(51) Int. Cl.
| H01L 31/02 | (2006.01) |
| G02B 6/42 | (2006.01) |
| H01L 31/0203 | (2014.01) |
| H01L 31/0232 | (2014.01) |

(52) U.S. Cl.
CPC *G02B 6/42* (2013.01); *G02B 6/421* (2013.01); *G02B 6/428* (2013.01); *G02B 6/4214* (2013.01); *H01L 31/0203* (2013.01); *H01L 31/0232* (2013.01)

(58) Field of Classification Search
CPC ............ H01L 31/0203; H01L 31/0232; H01L 27/14645; G02B 6/42; G02B 6/421

USPC .......................................................... 257/432
See application file for complete search history.

(56) References Cited

U.S. PATENT DOCUMENTS

| 4,952,019 | A | * | 8/1990 | Evans et al. ...................... 385/14 |
| 5,026,148 | A | * | 6/1991 | Wen et al. .................. 359/485.03 |
| 5,150,182 | A | * | 9/1992 | Capps et al. ................... 257/436 |
| 5,502,779 | A | * | 3/1996 | Magel ............................... 385/1 |
| 2007/0160319 | A1 | * | 7/2007 | Wang ............................... 385/14 |
| 2010/0295178 | A1 | * | 11/2010 | Ishihara et al. ................ 257/737 |
| 2011/0108705 | A1 | * | 5/2011 | Izuha et al. .................. 250/208.1 |
| 2012/0290255 | A1 | * | 11/2012 | Kelkar et al. .................. 702/150 |
| 2013/0182331 | A1 | * | 7/2013 | Hebrink ......................... 359/601 |
| 2013/0301986 | A1 | * | 11/2013 | Nakano et al. .................. 385/31 |
| 2014/0070350 | A1 | * | 3/2014 | Kim et al. ..................... 257/432 |
| 2014/0183331 | A1 | * | 7/2014 | Sheu ............................. 250/206 |

FOREIGN PATENT DOCUMENTS

| JP | 59-7910 | 1/1984 |
| JP | 5-264832 | 10/1993 |
| JP | 2002-131565 | 5/2002 |
| JP | 2006-71801 | 3/2006 |
| JP | 2006-323317 | 11/2006 |

* cited by examiner

*Primary Examiner* — Nathan Ha
(74) *Attorney, Agent, or Firm* — Fujitsu Patent Center

(57) ABSTRACT

A disclosed optical semiconductor element includes: a semiconductor substrate having a first main surface and a second main surface in which a plurality of first grooves are formed; a first optical waveguide defined by portions of the semiconductor substrate between the first grooves and having side faces defined by the first grooves; and a photoelectric converter configured to transmit or receive an optical signal propagating through the first optical waveguide. Moreover, the first grooves define part of a guide hole.

12 Claims, 31 Drawing Sheets

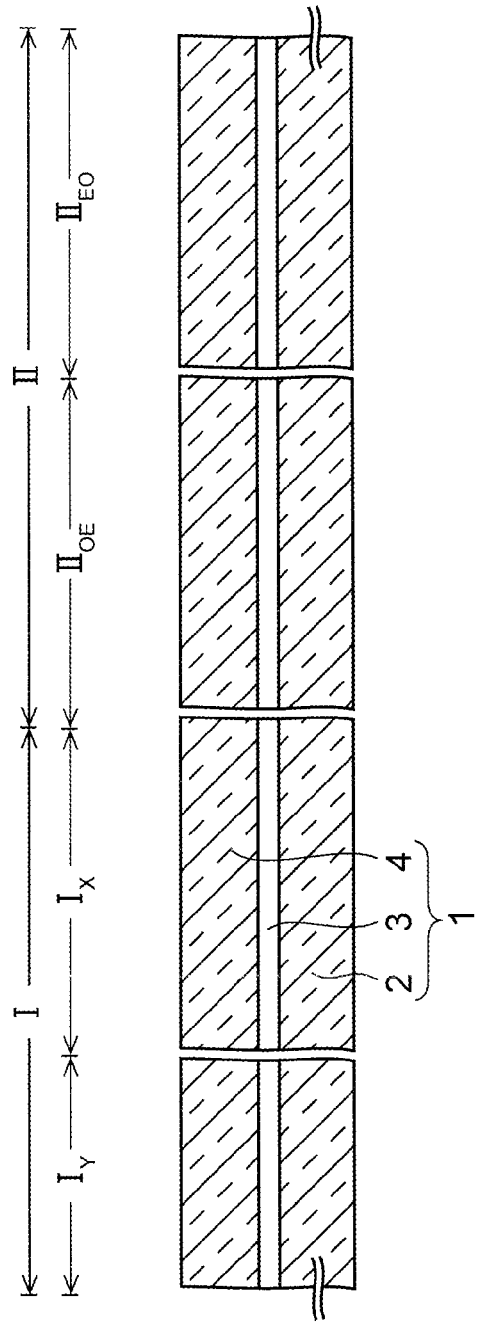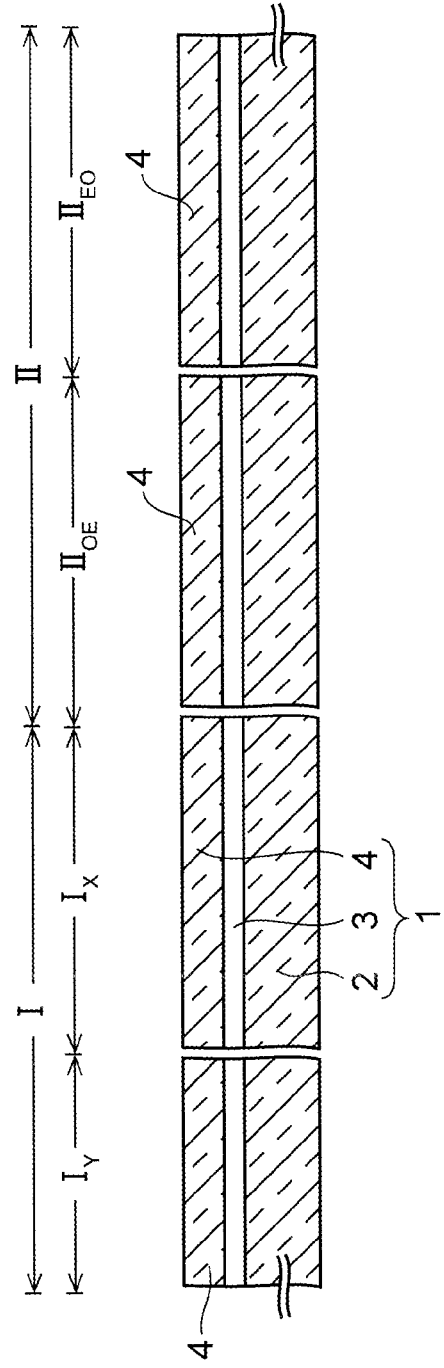

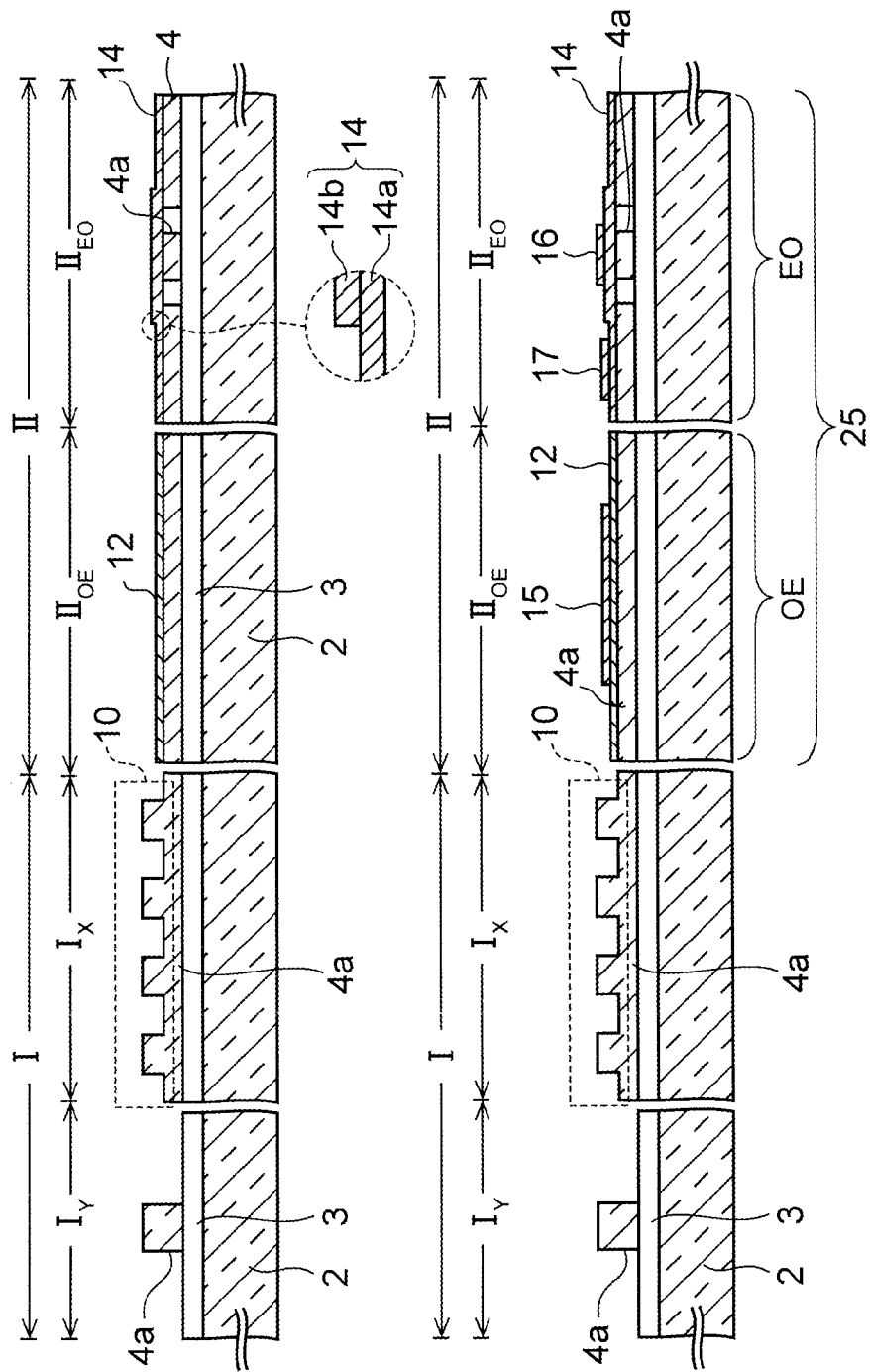

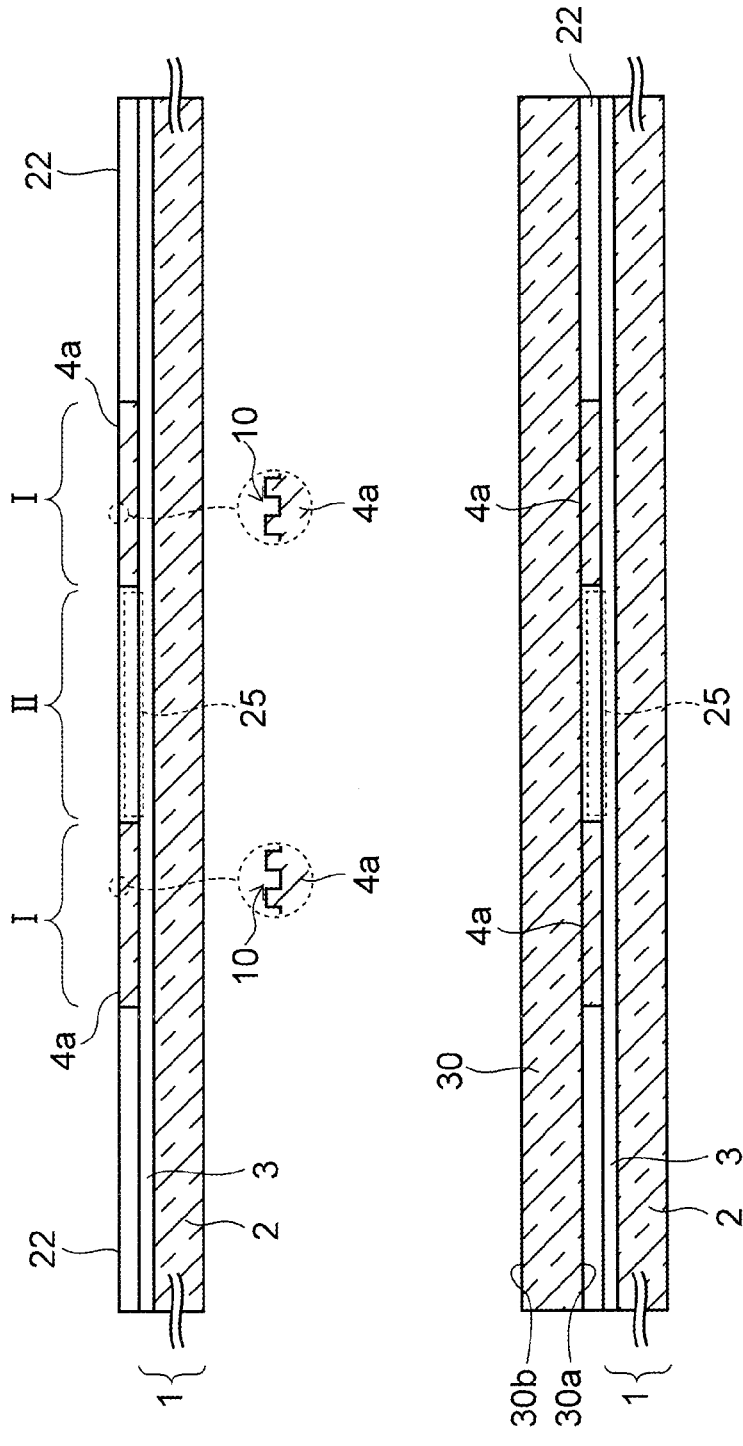

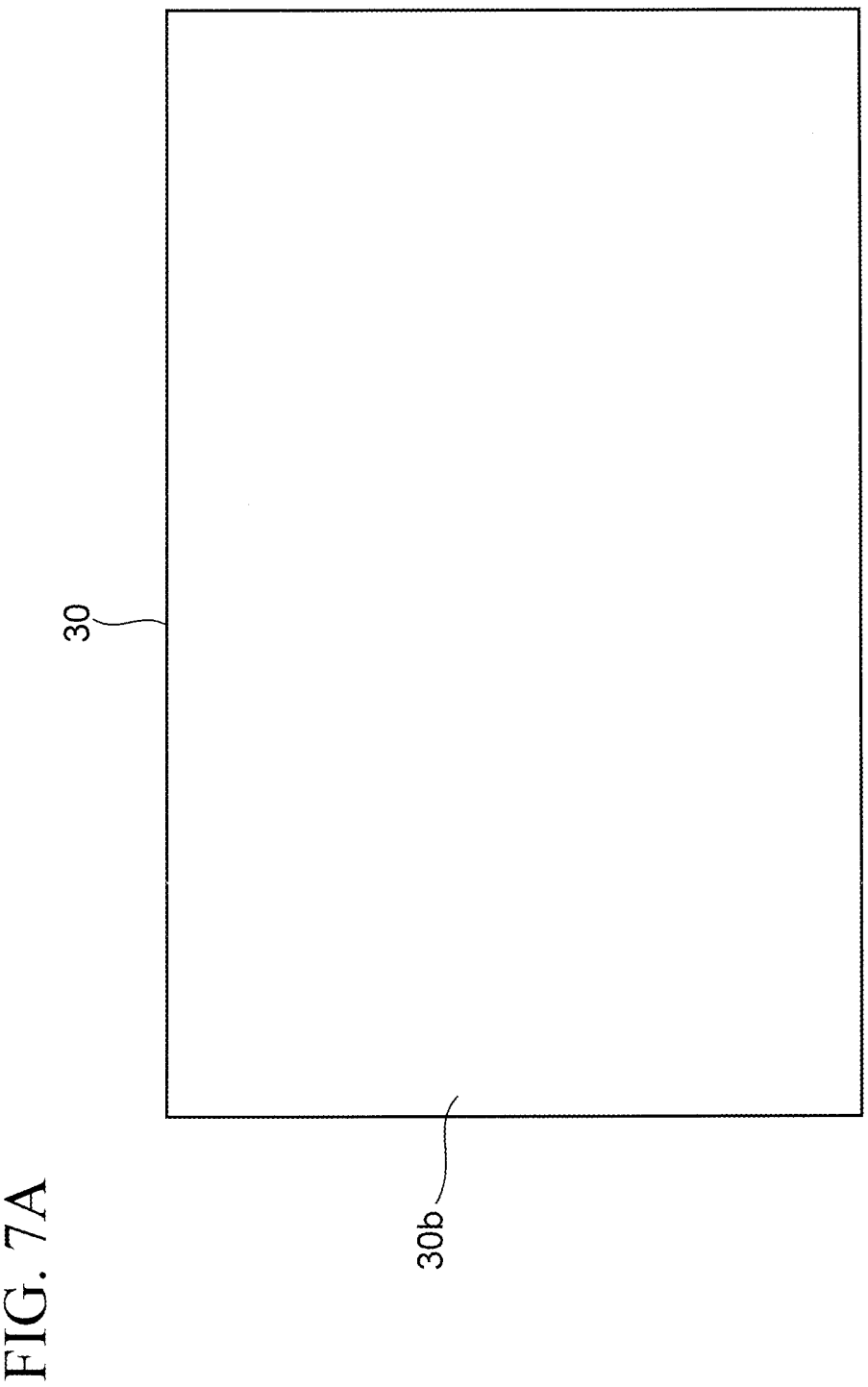

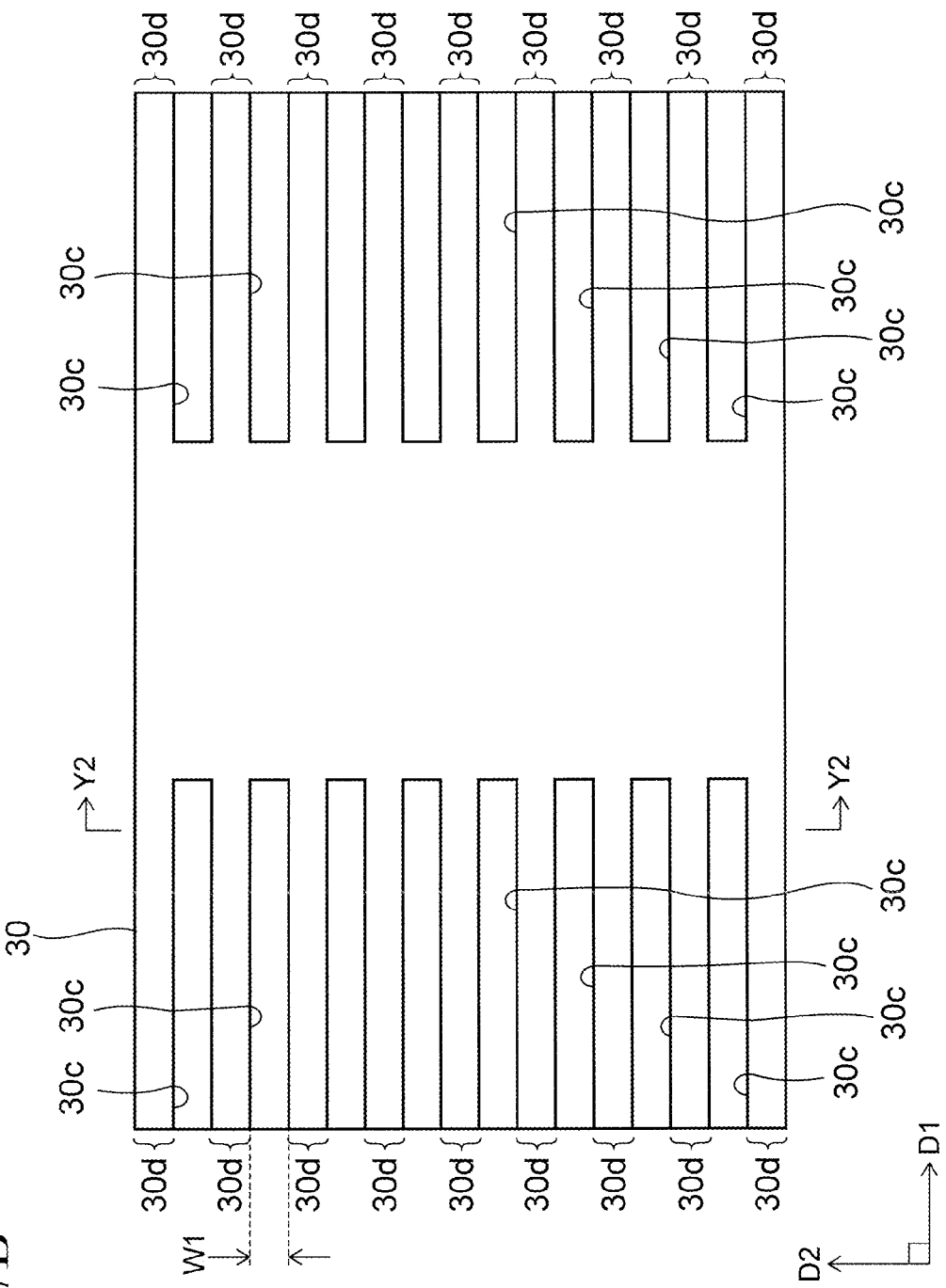

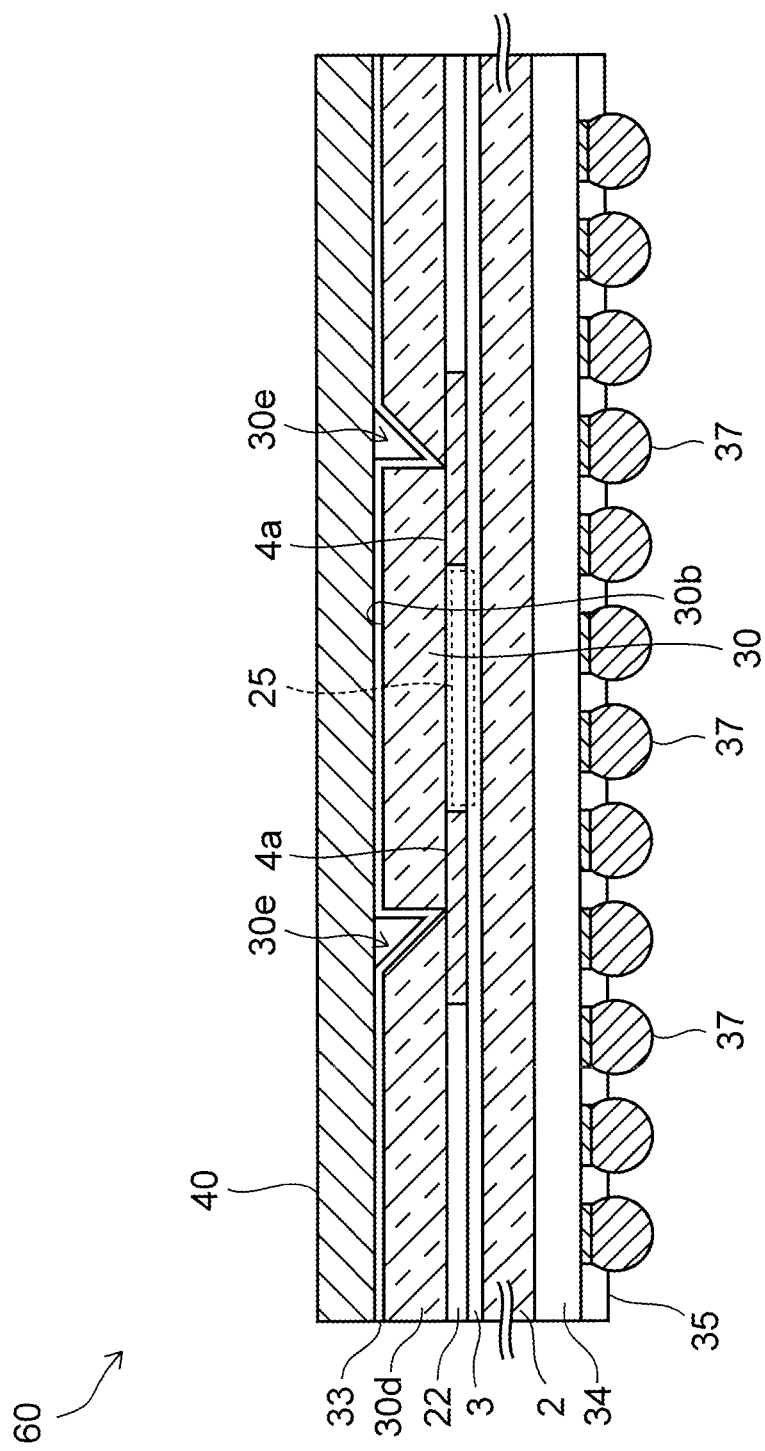

OPTICAL SEMICONDUCTOR ELEMENT AND METHOD OF MANUFACTURING THE SAME

CROSS-REFERENCE TO RELATED APPLICATION

This application is based upon and claims the benefit of priority of the prior Japanese Patent Application No. 2013-196774, filed on Sep. 24, 2013, the entire contents of which are incorporated herein by reference.

FIELD

The embodiments discussed herein are related to an optical semiconductor element and a method of manufacturing the same.

BACKGROUND

With the arrival of an advanced information society, optical communication technologies capable of transferring information at high speed are about to be realized. These optical communication technologies use an optical semiconductor element for converting optical signals transferred through optical fibers into electric signals or, conversely, converting electric signals into optical signals.

In order to reduce the loss of optical signals, it is effective to couple the optical fibers to optical waveguides included in the optical semiconductor element, and also to improve the accuracy of alignment of the optical fibers and the optical waveguides so that the optical signals transferred through the optical fibers may mostly be introduced into the optical semiconductor element.

Further, reducing the size of a mechanism coupling the optical fibers and the optical waveguides may contribute to reduction of the size of an electronic device on which these components are mounted.

Note that technologies related to the present application are disclosed in Japanese Laid-open Patent Publication Nos. 2006-323317, 2002-131565, 05-264832, 2006-71801, and 59-7910.

SUMMARY

According to one aspect of the following disclosure, there is provided an optical semiconductor element, including: a semiconductor substrate having a first main surface and a second main surface in which a plurality of first grooves are formed; a first optical waveguide defined by portions of the semiconductor substrate between the first grooves and having side faces defined by the first grooves; and a photoelectric converter configured to transmit or receive an optical signal propagating through the first optical waveguide, in which the first grooves define part of a guide hole.

According to another aspect of the disclosure, there is provided a method of manufacturing an optical semiconductor element, the method including: forming a photoelectric converter on a semiconductor layer, the photoelectric converter being configured to transmit or receive an optical signal; fixing a semiconductor substrate having a first main surface and a second main surface onto the photoelectric converter at the first main surface; and after the fixing the semiconductor substrate, forming a plurality of first grooves in the second main surface of the semiconductor substrate to thereby make portions of the semiconductor substrate between the first grooves into a first optical waveguide through which the optical signal propagates, the plurality of first grooves defining part of a plurality of guide holes.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

FIGS. 5A to 5K are enlarged cross-sectional views of the optical semiconductor element according to the first embodiment in process of manufacture;

FIGS. 6A to 6C are overall cross-sectional views of the optical semiconductor element according to the first embodiment in process of manufacture;

FIGS. 7A and 7B are plan views of the optical semiconductor element according to the first embodiment in process of manufacture;

FIGS. 11A to 11E are overall cross-sectional views of the optical semiconductor element according to the first embodiment in process of manufacture;

DESCRIPTION OF EMBODIMENTS

Before describing embodiments, the result of a study conducted by the inventor of the present application will be described.

In optical communication technologies, an optical signal transferred through an optical fiber is converted into an electric signal for the purpose of modulating the optical signal.

Figure 1:
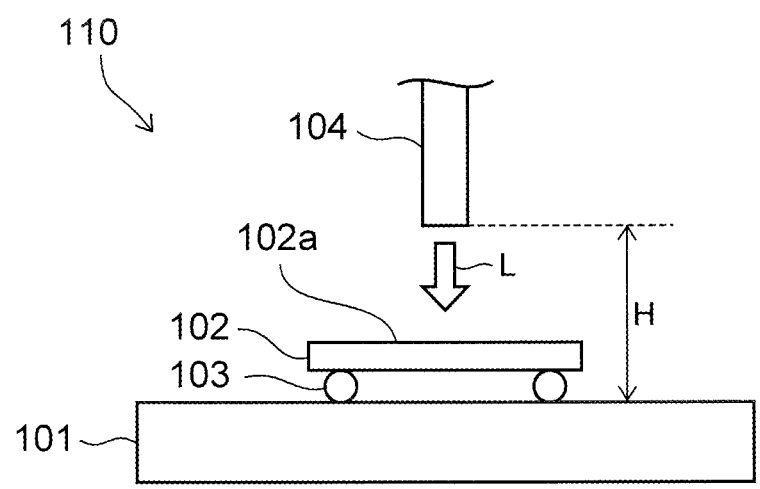
FIG. 1 is a schematic view illustrating an example of an optical semiconductor element.

FIG. 1 is a schematic view illustrating an example of an optical semiconductor element 110 for converting an optical signal into an electric signal.

In this optical semiconductor element 110, a phototransistor 102 is mounted on a wiring board 101 with external connection terminals 103 interposed therebetween. Moreover, an optical signal L transferred through an optical fiber 104 enters a light receiving surface 102a of the phototransistor 102 and is converted into an electric signal in the phototransistor 102.

In this example, the optical signal L is introduced to the phototransistor 102 from the normal direction of the wiring board 101. Thus, a height H from the wiring board 101 to the end of the optical fiber 104 is increased by the thicknesses of the phototransistor 102 and the external connection terminals 103. For this reason, it is difficult to reduce the size of the optical semiconductor element 110.

Further, in order to introduce the optical signal L to the phototransistor 102 without loss, the light receiving surface 102a and the optical fiber 104 are preferably accurately aligned with each other in an in-plane direction X of the wiring board 101. In the example of FIG. 1, there is no mechanism for such accurate alignment, and the optical signal L may possibly experience loss.

Hereinbelow, embodiments capable of size reduction and improvement in the accuracy of alignment with optical fibers will be described.

First Embodiment

Figure 2:
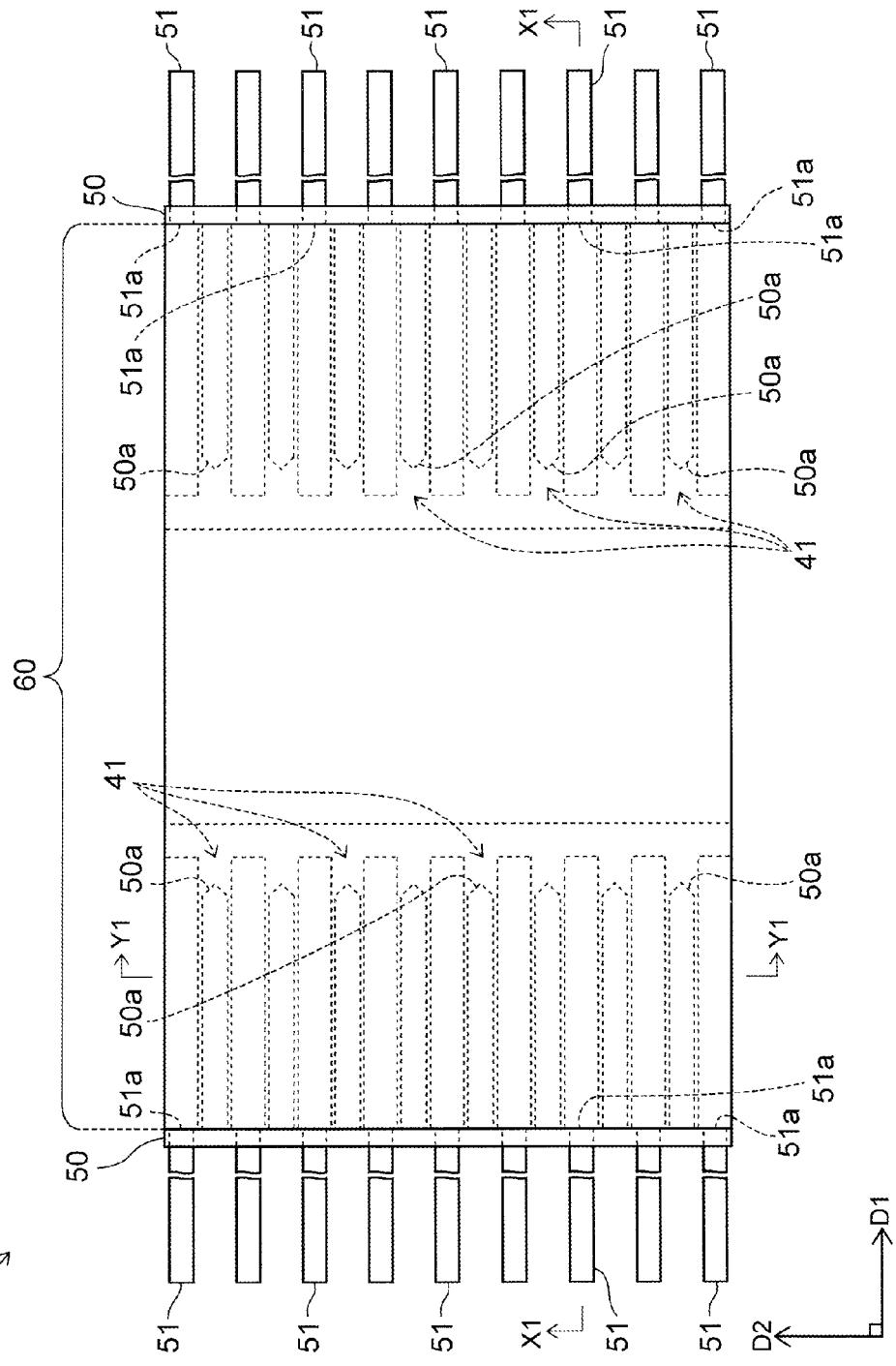
FIG. 2 is an overall plan view of an optical semiconductor element according to a first embodiment.

FIG. 2 is an overall plan view of an optical semiconductor element according to this embodiment.

As illustrated in FIG. 2, this optical semiconductor element 70 includes connectors 50 and an element body 60.

Each connector 50 is attachable to and detachable from the element body 60 and includes a plurality of single-mode (SM) optical fibers 51 and a plurality of guide pins 50a. The connector 50 including the optical fibers 51 as described above is also called a ferrule. Moreover, resin, for example, may be used as the material of the connector 50.

The plurality of guide pins 50a extend in a first direction D1 and are provided at given intervals in a second direction D2 perpendicular to the first direction D1.

The guide pins 50a are inserted in guide holes 41 in the element body 60. In this way, the optical fibers 51 and the element body 60 may be accurately aligned with each other.

Note that the diameter of the core of each optical fiber 51 is not particularly limited but, in this embodiment, the connector 50 includes optical fibers 51 each including a core with a diameter of approximately 10 μm.

Figure 3:
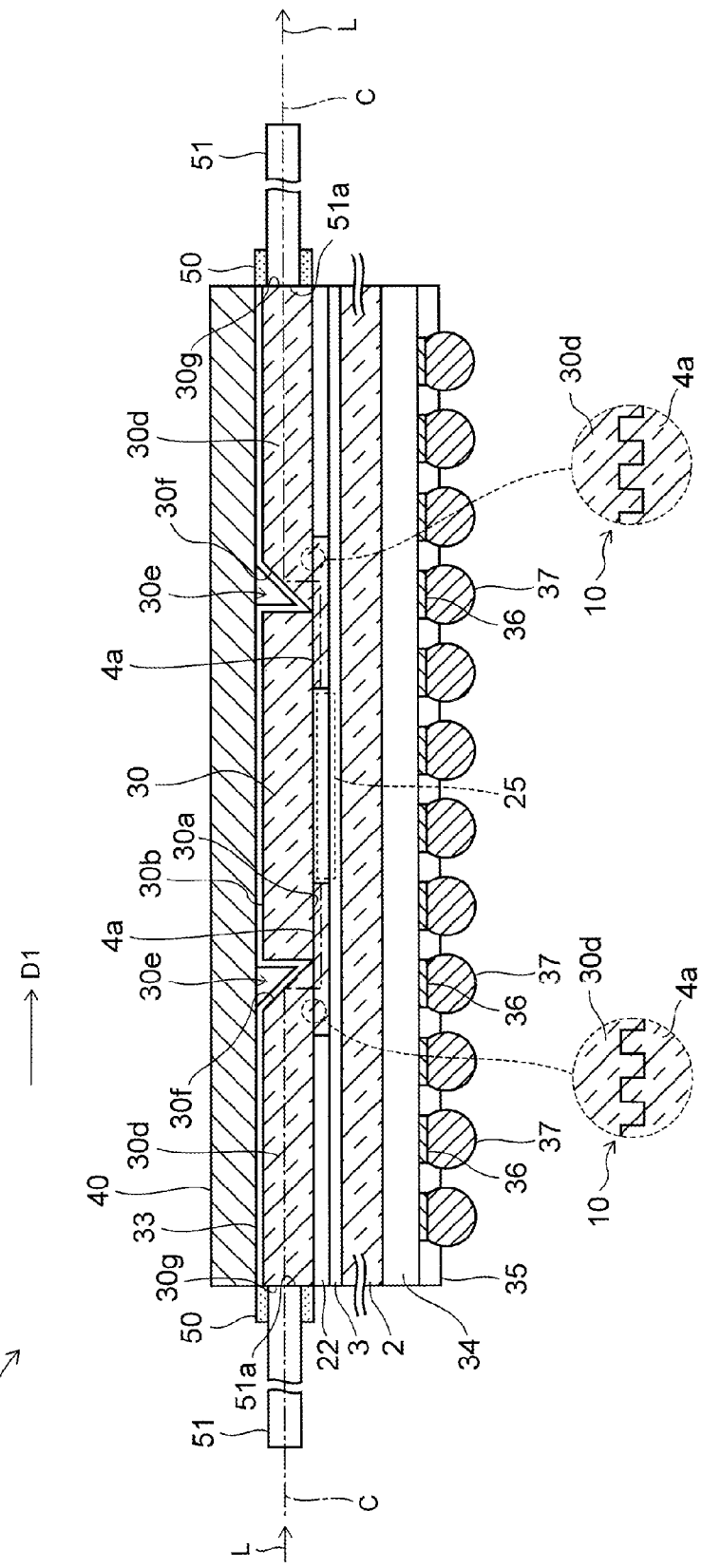
FIG. 3 is a cross-sectional view taken along line X1-X1 in FIG. 2.

FIG. 3 is a cross-sectional view taken along line X1-X1 in FIG. 2.

The optical semiconductor element 70 is configured to perform a predetermined process on optical signals L introduced along optical paths C, and includes a semiconductor substrate 30 having a first main surface 30a and a second main surface 30b.

The material of the semiconductor substrate 30 is not particularly limited, but a silicon substrate which light in an infrared range at and above a wavelength of 1000 nm may pass through is used as the semiconductor substrate 30 in the following description.

First optical waveguides 30d extending in the first direction D1 are provided in the semiconductor substrate 30 on the second main surface 30b side. The first optical waveguides 30d are optically connected to the optical fibers 51 held on the connector 50 and form the optical paths C of optical signals L in the infrared range in cooperation with the optical fibers 51.

The thickness of each first optical waveguide 30d is not particularly limited. In this embodiment, the thickness of the first optical waveguide 30d is set to about 10 μm to 200 μm.

A mirror surface 30f is provided at the end of each first optical waveguide 30d. The mirror surface 30f is configured to reflect an optical signal L propagating through the first optical waveguide 30d to bend the optical path C toward the first main surface 30a.

Note that the mirror surface 30f is defined by an inclined side face of a second groove 30e formed in the semiconductor substrate 30.

Further, a silicon oxide layer is provided as a cladding layer 33 on the surface of the first optical waveguide 30d and the mirror surface 30f. Since the refractive index of the silicon oxide layer is lower than that of silicon, an optical signal L may be kept inside the first optical waveguide 30d.

Note that the cladding layer 33 may be omitted if the loss of an optical signal L inside the first optical waveguide 30d is not problematic.

Moreover, a plate 40 is fixed to the second main surface 30b of the semiconductor substrate 30 with the above-mentioned cladding layer 33 interposed therebetween.

The plate 40 is made of aluminum nitride, which has good thermal conductivity, and serves as a heat sink configured to dissipate heat generated inside the optical semiconductor element 70 to the outside.

On the other hand, second optical waveguides 4a extending in the first direction D1 and photoelectric converters 25 are provided on the first main surface 30a of the semiconductor substrate 30.

The second optical waveguides 4a are made of a silicon transparent to light in the infrared range and are coupled to the first optical waveguides 30d under their mirror surfaces 30f.

Note that as illustrated inside the dotted-line circles, a grating coupler 10 is provided to the portion of each second optical waveguide 4a coupled to the corresponding first optical waveguide 30d. The grating coupler 10 has a function of efficiently introducing an optical signal L in the first optical waveguide 30d into the second optical waveguide 4a, and is prepared by providing asperities on the surface of the second optical waveguide 4a as will be described later.

In this embodiment, the length of each second optical waveguide 4a in the first direction D1 is set to approximately 40 μm, and the grating coupler 10 is formed on the entire upper face of the second optical waveguide 4a.

Moreover, each photoelectric converter 25 includes a light receiving element such as a phototransistor which receives an optical signal L, and a light emitting element such as a laser diode which transmits an optical signal L.

In this embodiment, the second optical waveguides 4a are coupled to both sides of the photoelectric converter 25. An optical signal L which has propagated through one of these second optical waveguides 4a is converted into an electric signal by the light receiving element of the photoelectric converter 25. This electric signal undergoes predetermined modulation, and is then converted into an optical signal by the light emitting element of the photoelectric converter 25 and outputted to the other second optical waveguide 4a.

Moreover, a first insulating layer 3 and a second insulating layer 22 are stacked on the first main surface 30a of the semiconductor substrate 30. A silicon base material is provided as a semiconductor base material 2 under the first insulating layer 3 and the second insulating layer 22. Note that silicon oxide layers, for example, may be formed as the first insulating layer 3 and the second insulating layer 22.

A circuit layer 34 and a protection layer 35 are provided in this order under the semiconductor base material 2. The circuit layer 34 includes transistors, wirings, and the like, and is electrically connected to the photoelectric converters 25.

Note that electrically connecting the photoelectric converters 25 and the circuit layer 34 prefers forming unillustrated through silicon vias (TSVs) in the semiconductor base material 2 and connecting the photoelectric converters 25 and the circuit layer 34 through the TSVs.

The function of the circuit layer 34 is not particular limited. In this embodiment, the circuit layer 34 is used to modulate electric signals converted from optical signals L in the photoelectric converters 25.

The protection layer 35 is a polyimide layer, for example, and used to protect the circuit layer 34 from the ambient atmosphere.

A plurality of copper electrode pads 36 are provided on the circuit layer 34, and a plurality of solder bumps are bonded as external connection terminals 37 to the electrode pads 36.

In the optical semiconductor element 70 as described above, the first optical waveguides 30d extend in the first direction D1 which is a lateral direction of the substrate, and therefore the optical fibers 51 may be connected to the lateral sides of the optical semiconductor element 70. Thus, the height of the element is prevented from becoming large. Accordingly, the size of the element may be reduced.

Moreover, since the mirror surface 30f is provided to each first optical waveguide 30d, an optical signal L introduced from the lateral direction of the substrate can be bent at the mirror surface 30f and supplied to the corresponding photoelectric converter 25. Thus, the optical signal L is not introduced from the normal direction of the semiconductor substrate 30. Accordingly, the height of the element may be prevented from becoming large as in the example of FIG. 1.

Figure 4:
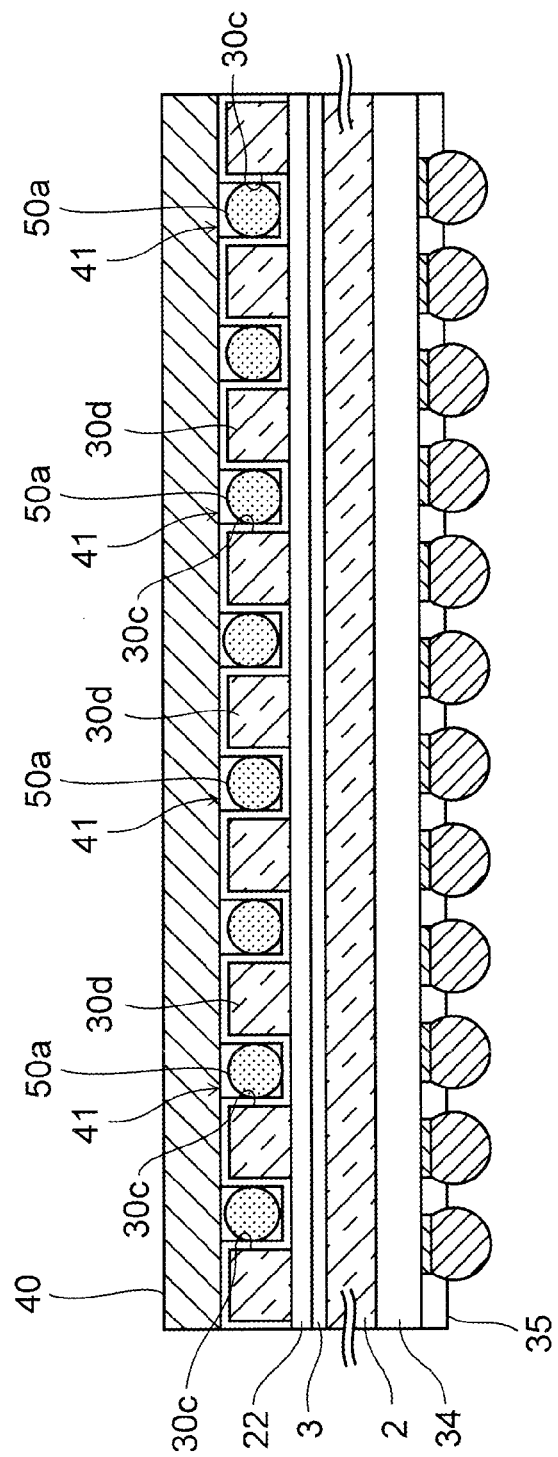
FIG. 4 is a cross-sectional view taken along line Y1-Y1 in FIG. 2.

FIG. 4 is a cross-sectional view taken along line Y1-Y1 in FIG. 2.

As illustrated in FIG. 4, the first optical waveguides 30d have a rectangular cross-sectional shape, and the side faces thereof are defined by first grooves 30c formed in the semiconductor substrate 30.

Moreover, part of the above-mentioned guide holes 41 in which the guide pins 50a are inserted, i.e. the side and bottom faces of the guide holes 41 are defined by the first grooves 30c, and the upper face of the guide holes 41 is defined by the surface of the plate 40.

With the guide pins 50a, the connectors 50 (see FIG. 3) and the element body 60 are aligned with each other. Accordingly, ends 51a of the optical fibers 51 and the first optical waveguides 30d may be accurately aligned with each other.

As described above, according to this embodiment, by coupling the optical fibers 51 to the element body 60 from the lateral direction as illustrated in FIG. 3, the height of the optical semiconductor element 70 may be prevented from becoming large. Further, by inserting the guide pins 50a into the guide holes 41 as illustrated in FIG. 4, the accuracy of alignment of the optical fibers 51 and the first optical waveguides 30d is improved as well.

Next, a method of manufacturing the optical semiconductor element according to this embodiment will be described.

FIGS. 5A to 5K are enlarged cross-sectional views of the optical semiconductor element according to this embodiment in process of manufacture. Note that in FIGS. 5A to 5K, the same components as those in FIGS. 2 to 4 are denoted by the same reference signs as those in these figures, and their description will be omitted below.

Moreover, FIGS. 5A to 5K each illustrate both a waveguide region I in which the above-described second optical waveguide 4a (see FIG. 3) is formed and a photoelectric conversion region II in which the above-described photoelectric converter 25 is formed. Note that the waveguide region I illustrates both a cross section $I_X$ taken along the first direction D1 (see FIG. 2) and a cross section $I_Y$ taken along the second direction D2.

Further, the photoelectric conversion region II illustrates both a cross-sectional view of a light receiving element region $II_{OE}$ in which the light receiving element is formed and a cross-sectional view of a light emitting element region $II_{EO}$ in which the light emitting element is formed. Among these, the cross-sectional view of the light receiving element region $II_{OE}$ is a cross-sectional view taken along the first direction D1 (see FIG. 2), while the cross-sectional view of the light emitting element region $II_{EO}$ is a cross-sectional view taken along the second direction D2.

First, as illustrated in FIG. 5A, a silicon on insulator (SOI) substrate in which a semiconductor base material 2, a first insulating film 3, and a semiconductor layer 4 are stacked in this order is prepared as a substrate 1. The thickness of the substrate 1 is not particularly limited. A silicon base material with a thickness of about 10 μm to 100 μm may be used as the semiconductor base material 2, and a silicon oxide film with a thickness of about 0.5 μm to 1 μm may be used as the first insulating film 3.

Moreover, the semiconductor layer 4 is a monocrystalline silicon layer and has a thickness of about 0.5 μm to 1 μm, for example.

Then, as illustrated in FIG. 5B, the semiconductor layer 4 is polished to reduce its thickness to about 0.1 μm.

Figure 5C:
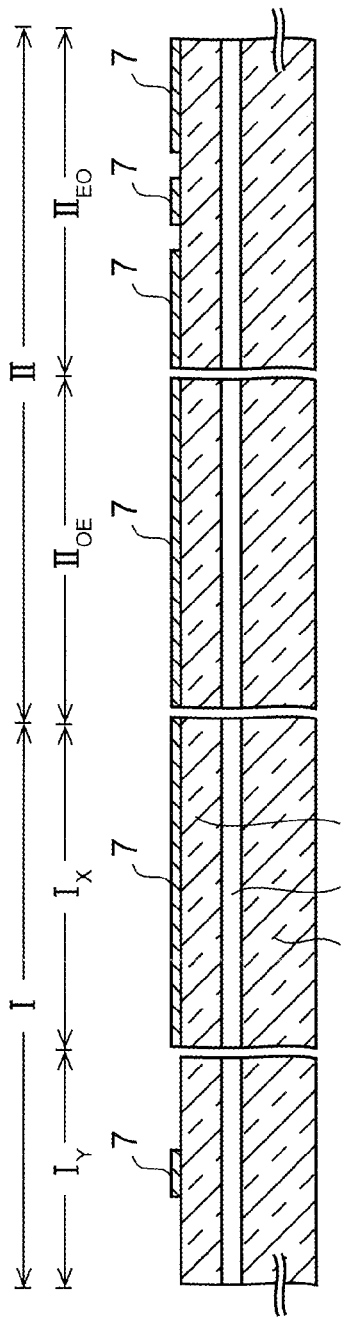

Thereafter, as illustrated in FIG. 5C, the semiconductor layer 4 is coated with a photoresist, which is then exposed and developed to be a first resist layer 7.

Figure 5D:
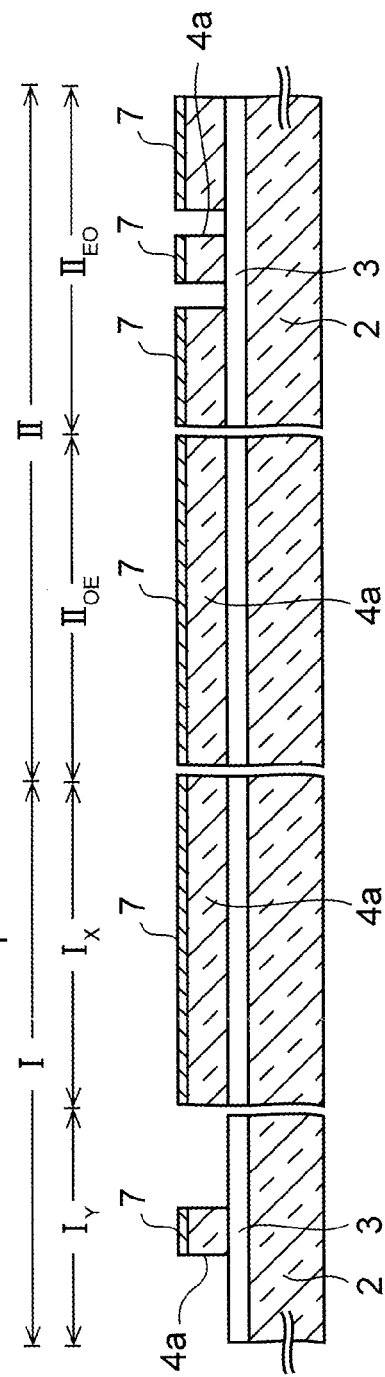

Then, as illustrated in FIG. 5D, the semiconductor layer 4 is patterned by dry etching using the first resist layer 7 as a mask, to thereby form the above-described second optical waveguide 4a in the semiconductor layer 4 in the waveguide region I and the photoelectric conversion region II.

Note that a $CF_4$ gas, for example, is available as an etching gas usable in the drying etching.

Thereafter, the first resist layer 7 is removed.

Figure 5E:
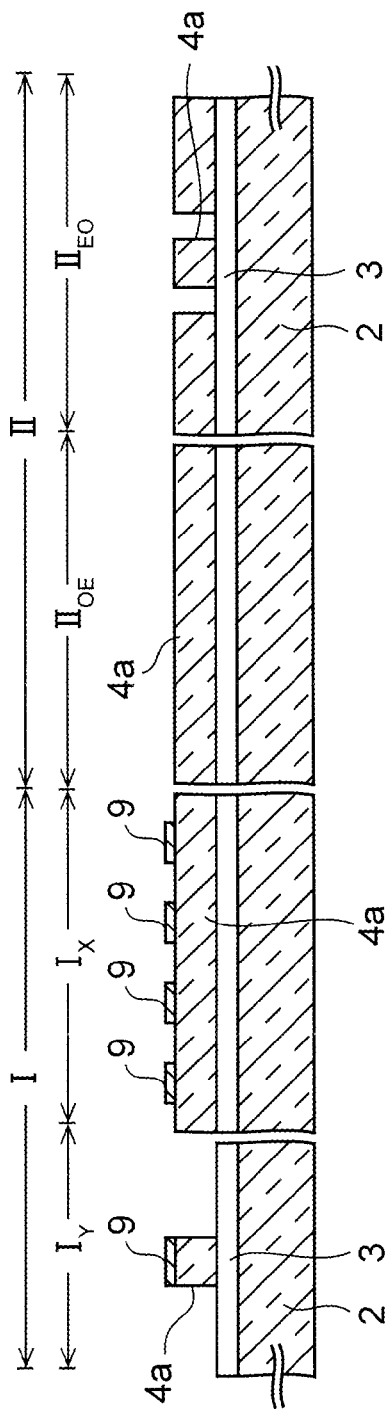

Thereafter, as illustrated in FIG. 5E, the semiconductor layer 4 is again coated with a photoresist, and the photoresist is then exposed and developed to form a second resist layer 9 on the second optical waveguide 4a.

Figure 5F:
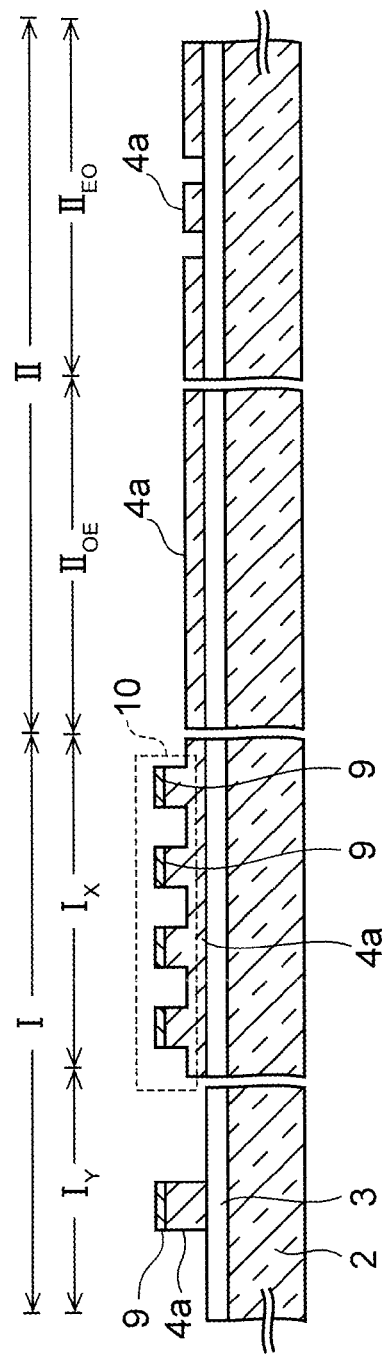

Then, as illustrated in FIG. 5F, the upper face of the second optical waveguide 4a is etched to a depth of about 10 nm by dry etching using the second resist layer 9 as a mask. As a result, a grating coupler 10 having a concavo-convex cross-sectional shape is formed on the upper face of the second optical waveguide 4a.

Note that a $CF_4$ gas, for example, is available as an etching gas usable in this step.

Figure 5G:
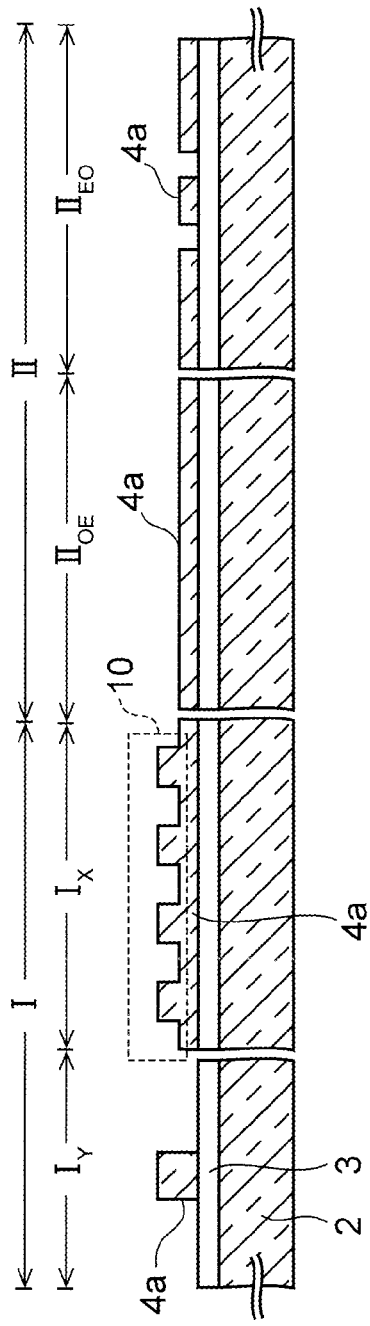

Thereafter, as illustrated in FIG. 5G, the second resist layer 9 is removed.

Figure 5H:
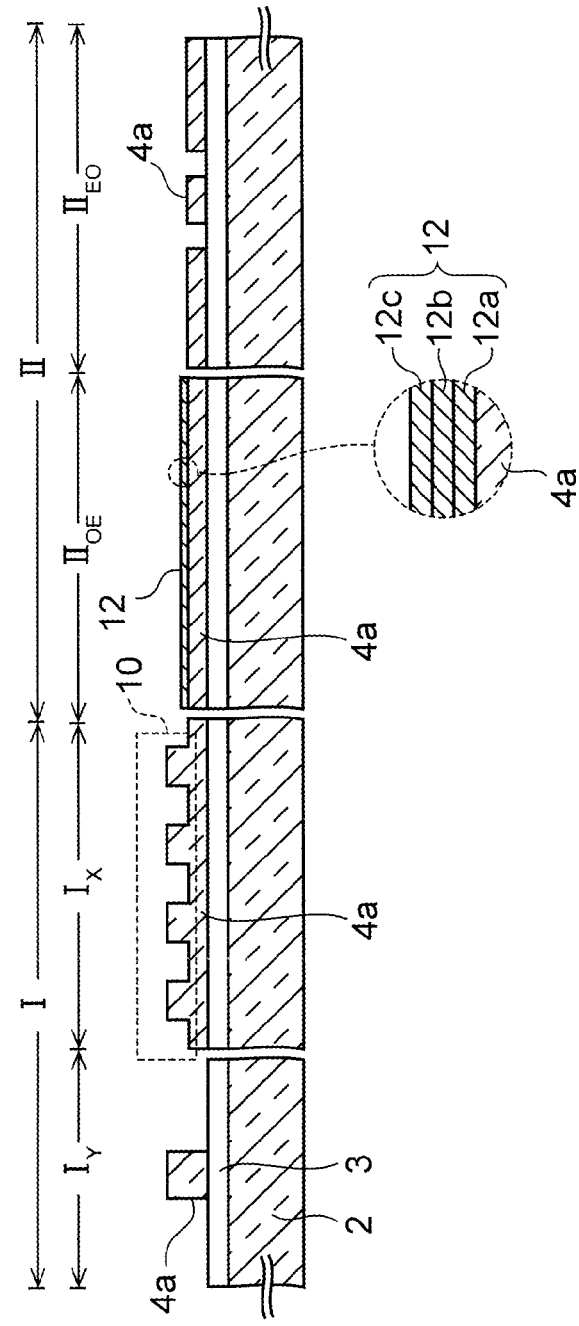

Then, as illustrated in FIG. 5H, a light receiving layer 12 is formed on the second optical waveguide 4a in the light receiving element region $II_{OE}$ by using a deposition method.

The light receiving layer 12 has a pin structure in which a p-type germanium layer 12a, an i-type germanium layer 12b, and an n-type germanium layer 12c are stacked in this order, and a photovoltage corresponding to the intensity of light inside the second optical waveguide 4a is generated between the p-type and n-type germanium layers 12a, 12c.

Note that the thickness of the light receiving layer 12 is not particularly limited. In this embodiment, the light receiving layer 12 is formed to a thickness of about 0.5 μm to 1 μm.

Subsequently, as illustrated in FIG. 5I, a light emitting layer 14 is attached to the second optical waveguide 4a in the light emitting element region $II_{EO}$ by using unillustrated adhesive.

The light emitting layer 14 is obtained by stacking an n-type semiconductor layer 14a and a p-type semiconductor layer 14b. Laser light is generated at the pn junction therebetween, and this laser light is introduced into the second optical waveguide 4a below.

Note that the material of each of the semiconductor layers 14a, 14b is not particularly limited. A III-V compound semiconductor such as GaAs or InP is usable as the material.

Then, as illustrated in FIG. 5J, gold films are formed on the light receiving layer 12 and the light emitting layer 14 by using a deposition method. These gold films are formed as the first to third electrodes 15 to 17.

By the steps so far, a pin photodiode is completed in the light receiving element region $II_{OE}$ as a light receiving element OE, and a laser element is completed in the light emitting region $II_{EO}$ as a light emitting element EO.

The second optical waveguide 4a in the light receiving element OE is the same as the second optical waveguide 4a in the waveguide region I. A photovoltage corresponding to an optical signal inside the second optical waveguide 4a is outputted from the light receiving element OE.

This photovoltage is modulated in the above-mentioned circuit layer 34, and then supplied to the light emitting element EO. The light emitting element EO outputs an optical signal corresponding to the modulated photovoltage to the second optical waveguide 4a.

These light receiving element OE and the light emitting element EO form the above-mentioned photoelectric converter 25.

Figure 5K:
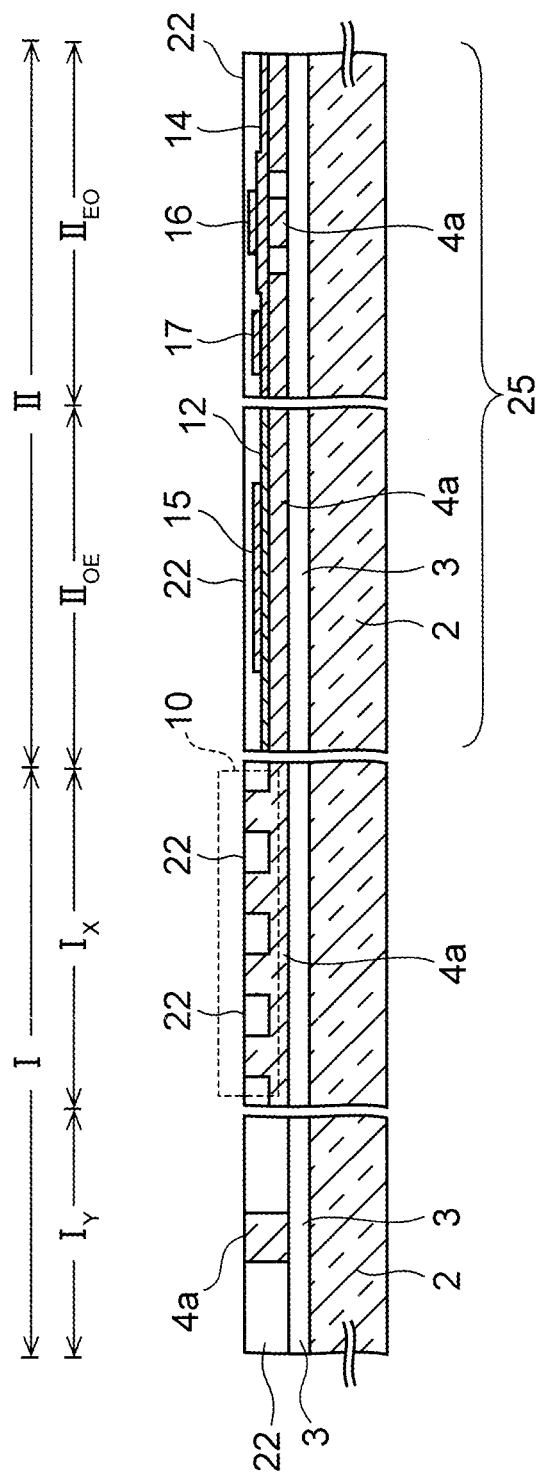

Then, as illustrated in FIG. 5K, a silicon oxide layer is formed as a second insulating layer 22 in each of the waveguide region I and the photoelectric conversion region II by CVD. Thereafter, the second insulating layer 22 is polished by CMP to expose the surface of the grating coupler 10 in the waveguide region I.

Subsequent steps will be described with reference to FIGS. 6A to 6C.

Figure 6C:
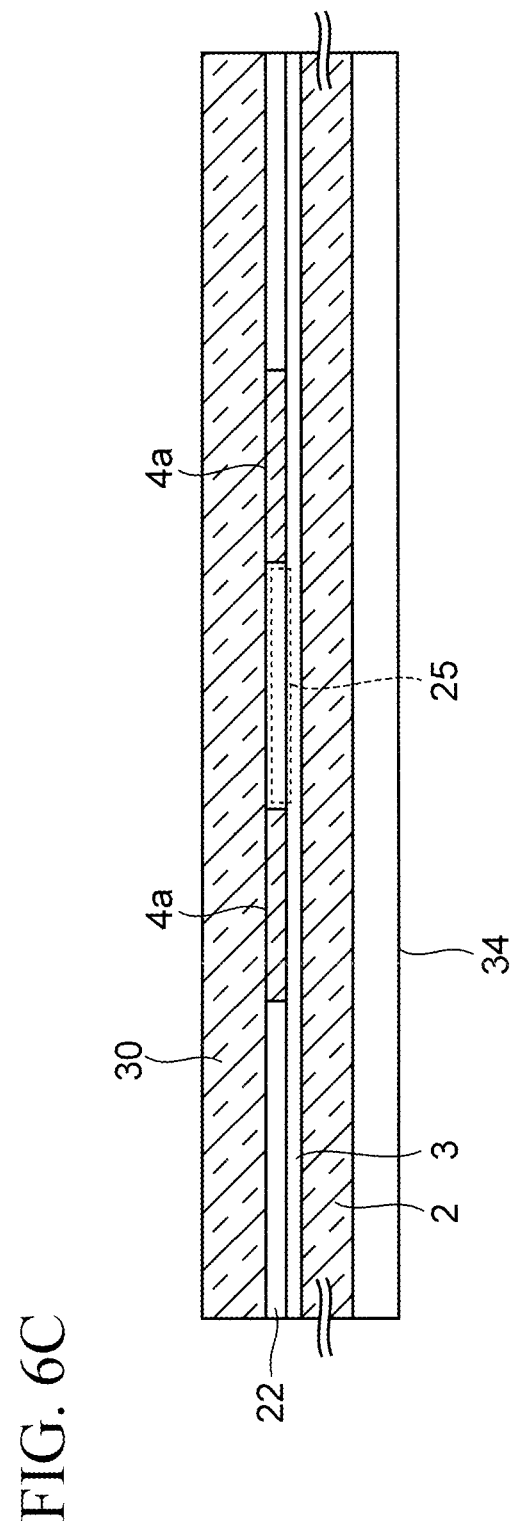

FIGS. 6A to 6C are overall cross-sectional views of the optical semiconductor element according to this embodiment in process of manufacture.

When the step in FIG. 5K is finished as described above, there is obtained a structure in which the grating coupler 10 of the second optical waveguide 4a in each waveguide region I is exposed as illustrated in the overall cross-sectional view in FIG. 6A. Moreover, in the photoelectric conversion region II, the photoelectric converter 25 including the above-mentioned light receiving element OE and the light emitting element EO is formed.

Then, as illustrated in FIG. 6B, a silicon substrate is prepared as the semiconductor substrate 30 having the first main surface 30a and the second main surface 30b, and the first main surface 30a is attached to the second insulating layer 22 and each second optical waveguide 4a. Note that unillustrated adhesive is used for the attachment.

Moreover, back grinding is performed on the second main surface 30b of the semiconductor substrate 30 to reduce the thickness of the semiconductor substrate 30 to 10 μm to 200 μm.

Then, as illustrated in FIG. 6C, transistors and wirings are formed on the semiconductor base material 2 by using semiconductor processes to thereby form the circuit layer 34.

FIG. 7A is a plan view of the semiconductor substrate 30 as seen from the second main surface 30b side after the above step is finished.

Now, the method shifts to steps for forming the first optical waveguides in the second main surface 30b of the semiconductor substrate 30.

First, as illustrated in a plan view in FIG. 7B, a blade such as a dicing saw is brought into contact with the second main surface 30b along the first direction D1 to form the plurality of first grooves 30c extending in the first direction D1 at given intervals.

A width W1 of each first groove 30c is not particularly limited. In this embodiment, the first groove 30c is formed such that the width W1 may be 100 μm to 150 μm.

Figure 8:
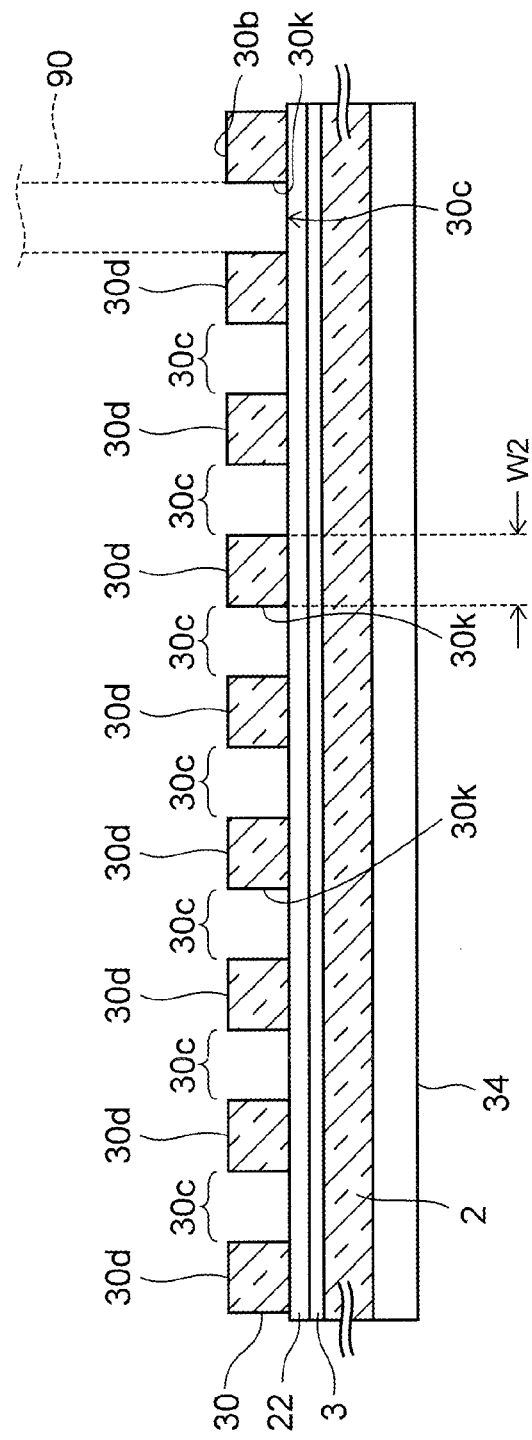
FIG. 8 is a cross-sectional view taken along line Y2-Y2 in FIG. 7B.

FIG. 8 is a cross-sectional view taken along line Y2-Y2 in FIG. 7B.

As illustrated in FIG. 8, in this example, a blade 90 is brought into contact perpendicularly with the second main surface 30b, so that the side faces of each groove 30c are formed perpendicularly to the second main surface 30b.

By this step, the plurality of first optical waveguides 30d with side faces 30k defined by the first grooves 30c are formed. A width W2 of each first optical waveguide 30d is about 10 μm, which is the same as the diameter of the core of each optical fiber 51.

Figure 9:
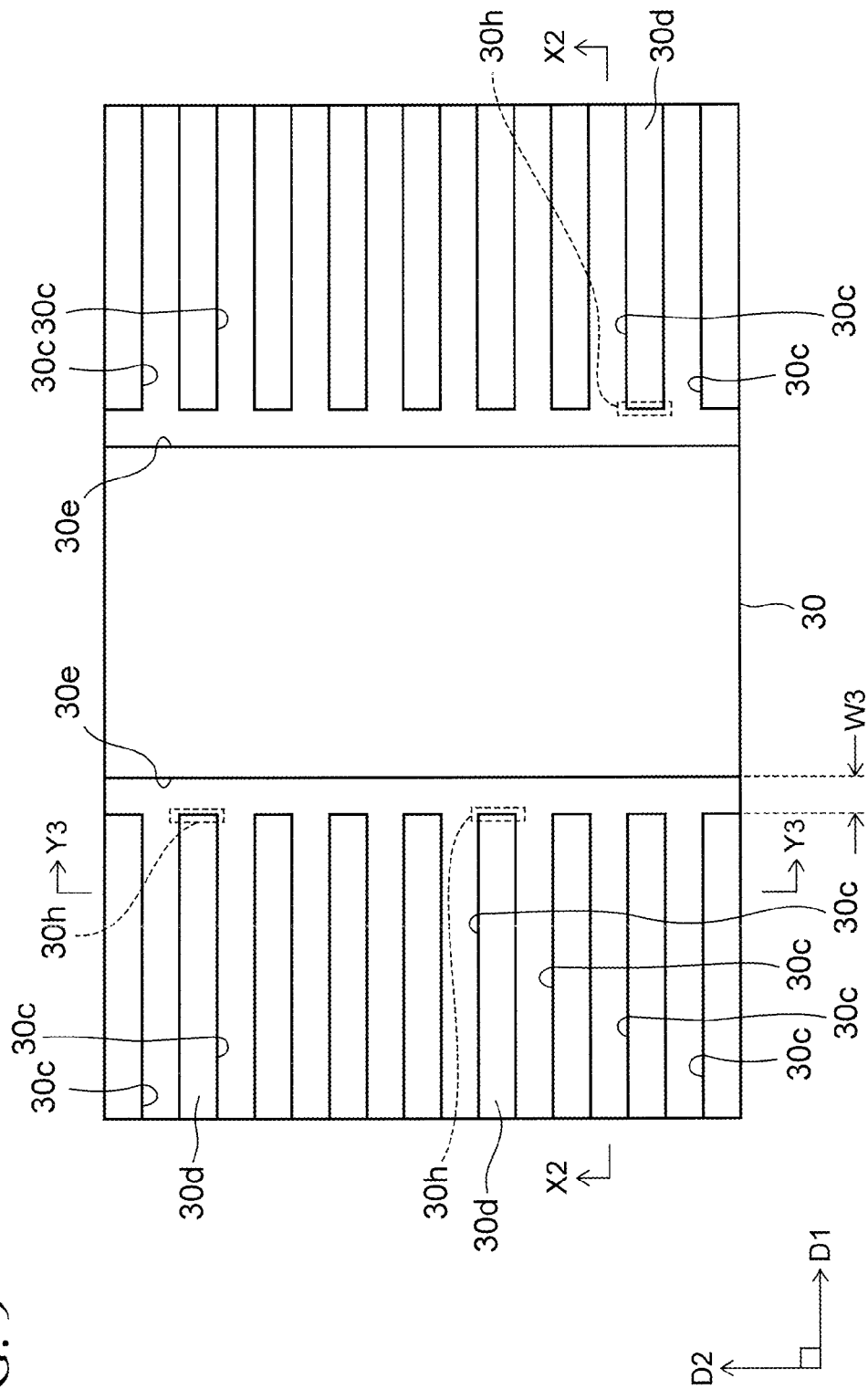
FIG. 9 is a plan view of the optical semiconductor element according to the first embodiment in process of manufacture.

Then, as illustrated in a plan view in FIG. 9, a blade such as a dicing saw is brought into contact with the second main surface 30b along the second direction D2 to form the second grooves 30e extending in the second direction D2.

The second grooves 30e are formed in such a way as to cross the first grooves 30c, and overlap ends 30h of the first optical waveguides 30d.

Meanwhile, a width W3 of each second groove 30e is not particularly limited. In this embodiment, the second groove 30e is formed such that the width W3 may be about 100 μm to 150 μm.

Figure 10:
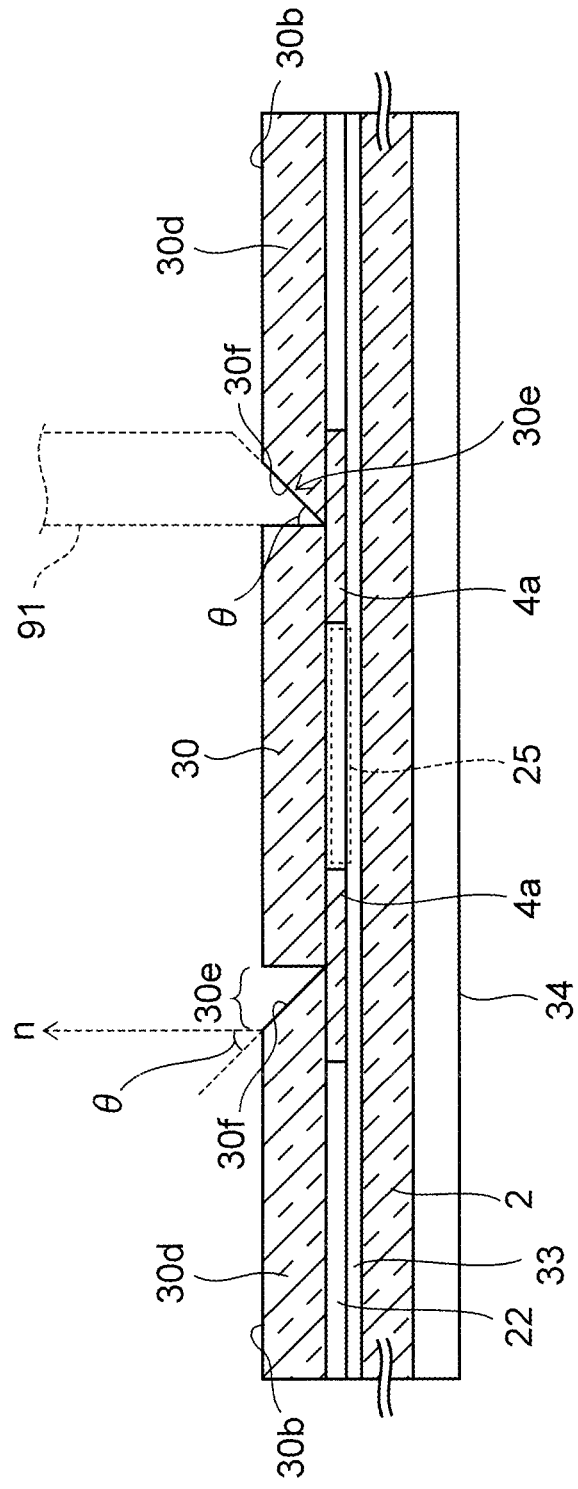
FIG. 10 is a cross-sectional view taken along line X2-X2 in FIG. 9.

FIG. 10 is a cross-sectional view taken along line X2-X2 in FIG. 9.

As illustrated in FIG. 10, in this example, a blade 91 with its edge inclined with respect to the second main surface 30b is brought into contact therewith to form a side face of each second groove 30e into an inclined surface, and this inclined surface is formed as the above-mentioned mirror surface 30f.

The angle θ between this mirror surface 30f and a normal direction n of the second main surface 30b is 45°, for example.

Note that each first optical waveguide 30d on which the mirror surface 30f is formed is formed in such a way as to be coupled to the corresponding second optical waveguide 4a under the mirror surface 30f.

Subsequent steps will be described with reference to FIGS. 11A to 11E. FIGS. 11A to 11E are overall cross-sectional views of the optical semiconductor element according to this embodiment in process of manufacture.

Figure 11A:
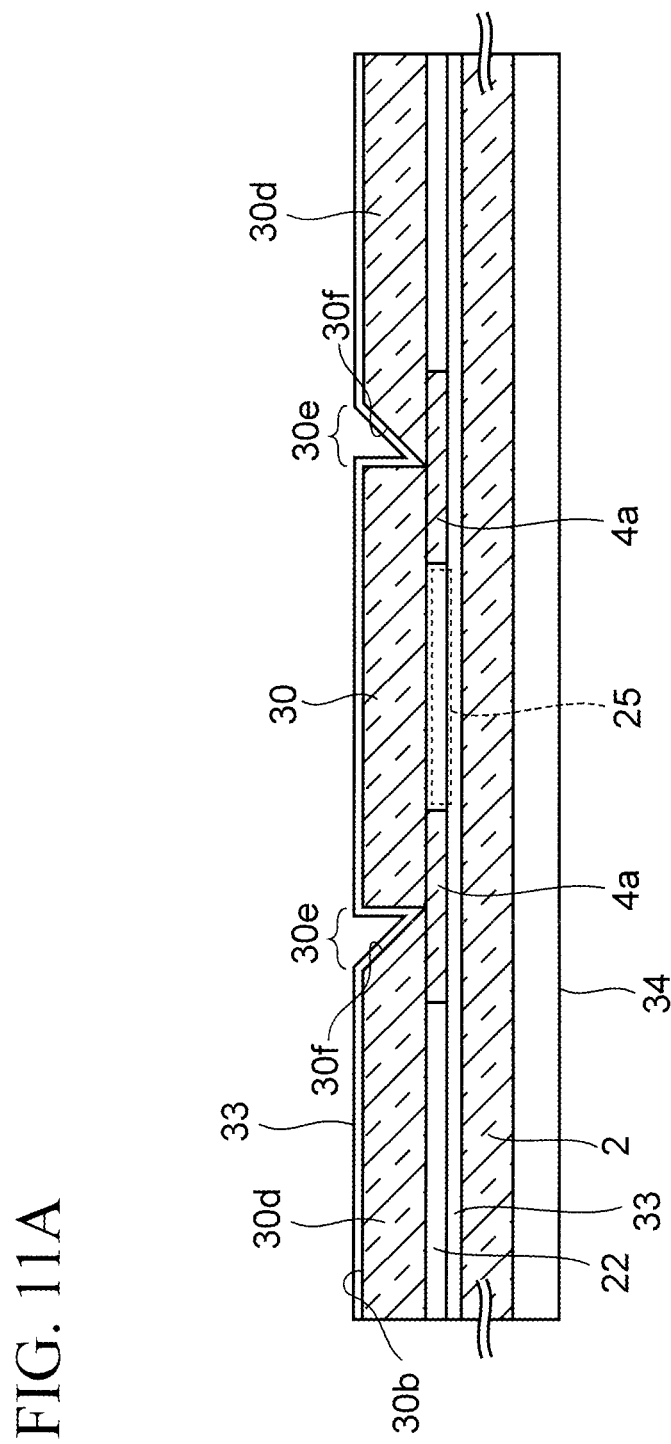

First, as illustrated in FIG. 11A, the upper face of each first optical waveguide 30d and each mirror surface 30f are thermally oxidized to form a thermally-oxidized layer with a thickness of about 500 nm to 1000 nm as the cladding layer 33.

With thermal oxidation, the cladding layer 33 may be easily formed by oxidizing the silicon at the surface of each first optical waveguide 30d and each mirror surface 30f. Note that instead of the thermally-oxidized layer, a silicon oxide film by CVD may be formed as the cladding layer.

Figure 11B:
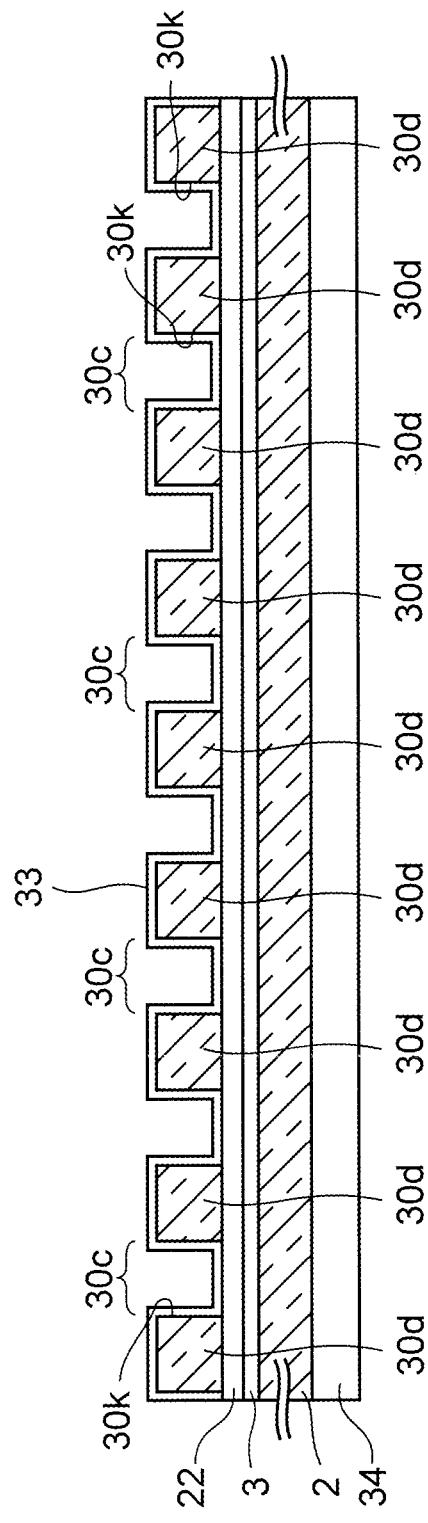

FIG. 11B is a cross-sectional view taken along the second direction D2 after the above step is finished, and corresponds to a cross-sectional view taken along line Y3-Y3 in FIG. 9.

As illustrated in FIG. 11B, the above-mentioned cladding layer 33 is formed on the side faces 30k of each first optical waveguide 30d as well.

Figure 11C:
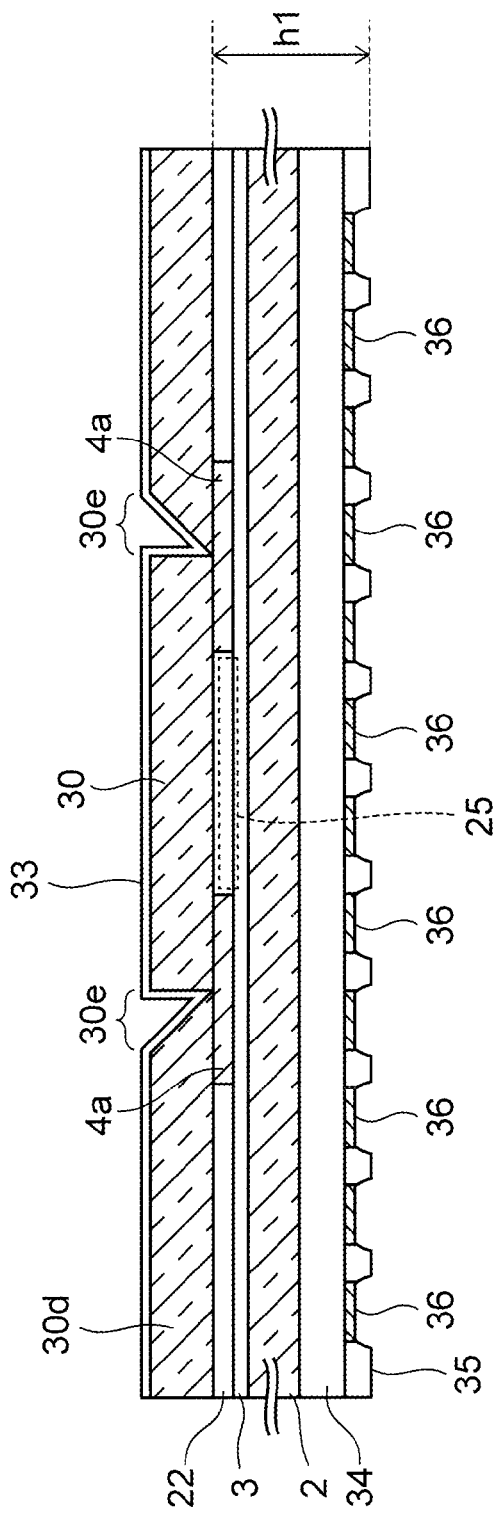

Then, as illustrated in FIG. 11C, a copper film is formed on the circuit layer 34 by electroplating or the like, and this copper film is patterned to form the plurality of electrode pads 36.

Thereafter, a polyimide layer having openings through which the electrode pads 36 may be exposed is formed on the circuit layer 34, and this polyimide layer is formed as the protection layer 35.

A height h1 from the lower face of the protection layer 35 to the lower face of the first optical waveguide 30d is about 10 μm, for example.

Figure 11D:
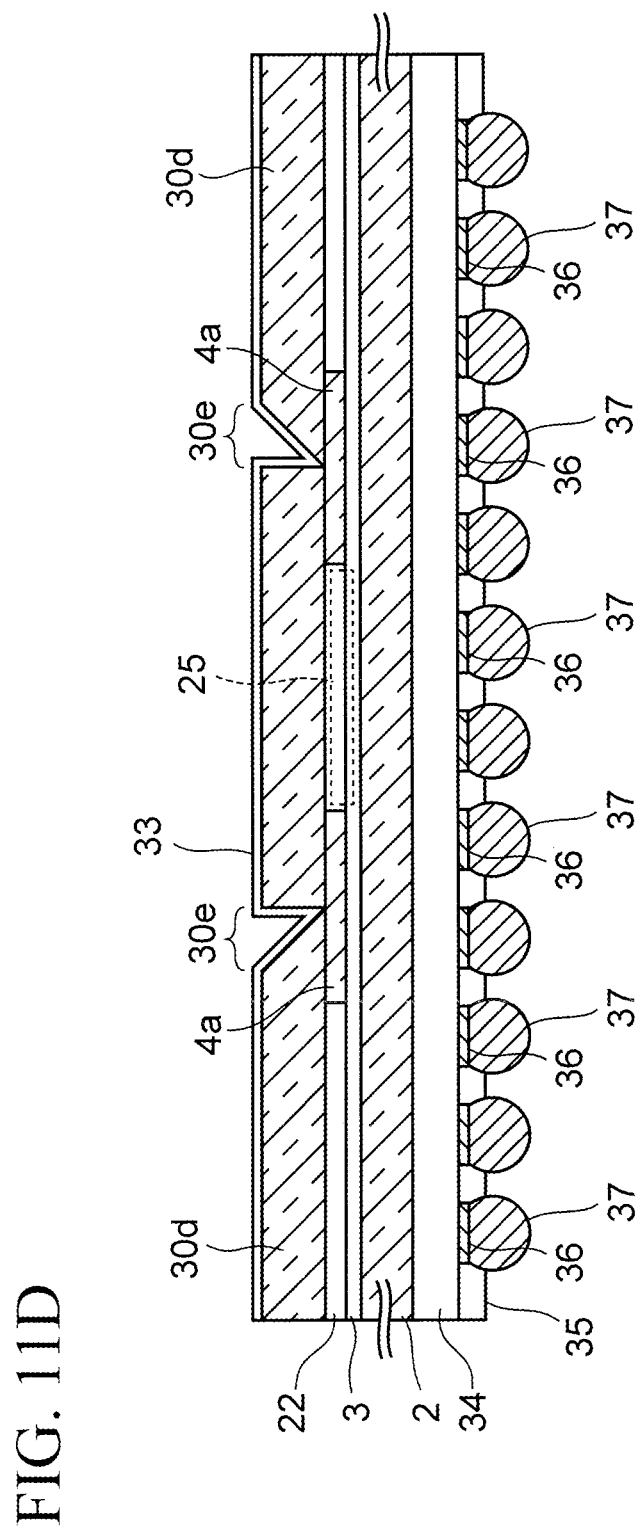

Subsequently, as illustrated in FIG. 11D, the solder bumps are bonded as external connection terminals 37 to the electrode pads 36 exposed from the protection layer 35.

Then, as illustrated in FIG. 11E, the plate 40 is fixed to the second main surface 30b of the semiconductor substrate 30 and the upper face of each first optical waveguide 30d with the cladding layer 33 interposed therebetween. As mentioned earlier, the plate 40 is used as a heat sink, and an aluminum nitride plate or the like having good thermal conductivity may be used as the plate 40.

Moreover, unillustrated adhesive may be used to fix the plate 40 to the cladding layer 33.

By the steps so far, the basic structure of the element body 60 is completed.

Figure 12:
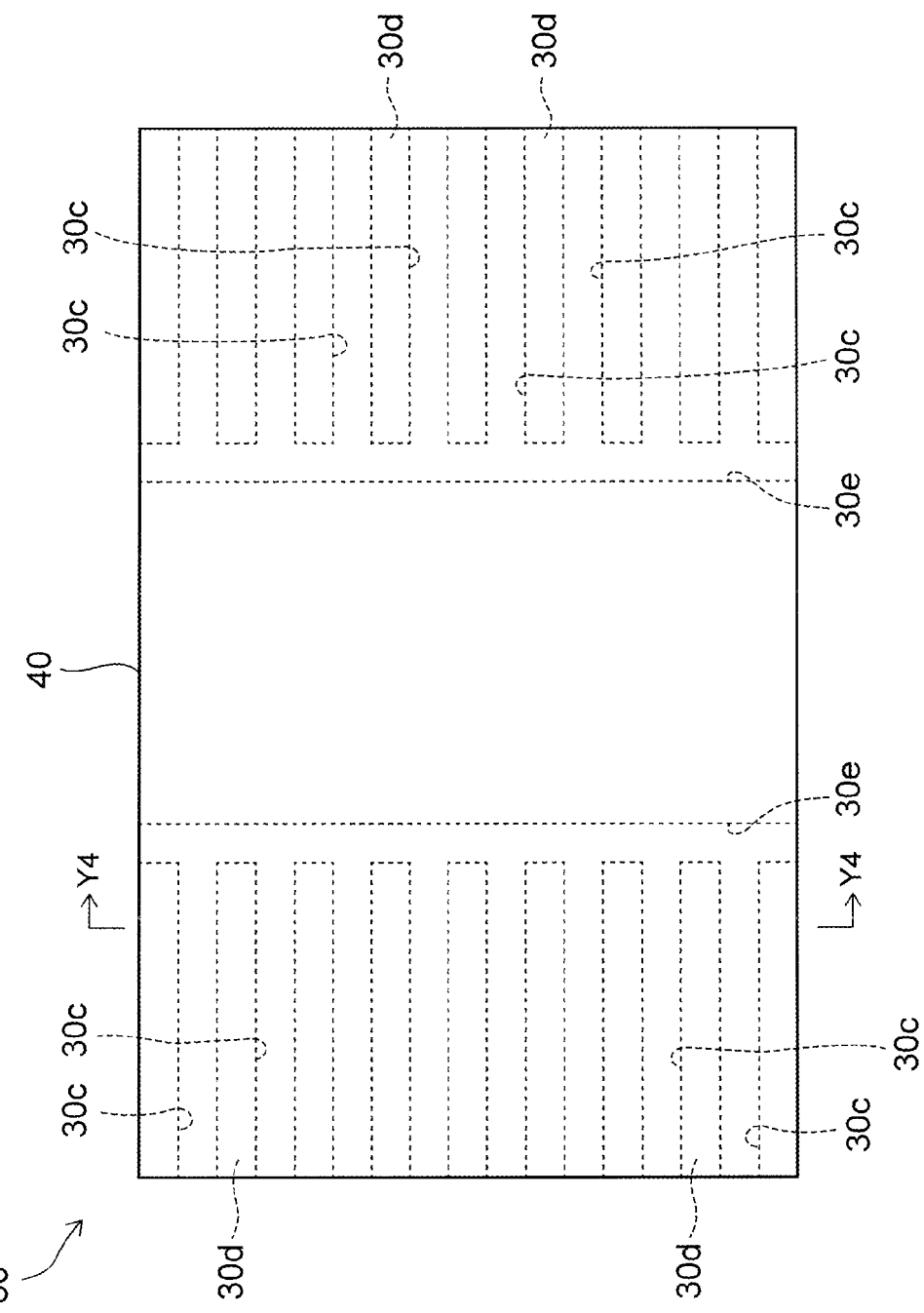
FIG. 12 is a plan view of the optical semiconductor element according to the first embodiment in process of manufacture.

FIG. 12 is a plan view of the element body 60 as seen from the plate 40 side after the above step is finished.

Figure 13:
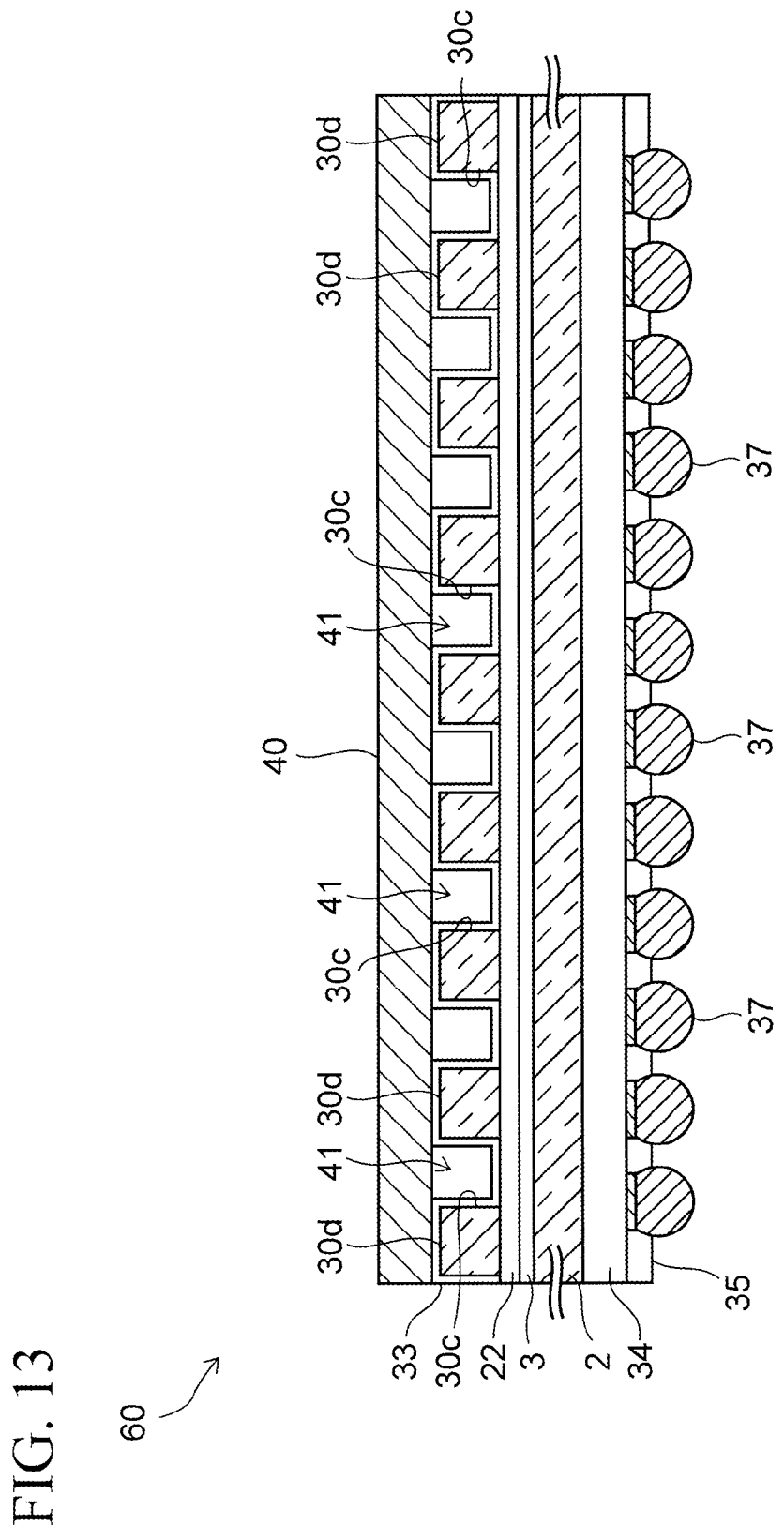
FIG. 13 is a cross-sectional view taken along line Y4-Y4 in FIG. 12.

Also, FIG. 13 is a cross-sectional view taken along line Y4-Y4 in FIG. 12.

As illustrated in FIG. 13, the plurality of guide holes 41 are defined by the first grooves 30c and the plate 45.

Now, the method shifts to steps for connecting each connector 50 (see FIG. 2) to the element body 60.

Figure 14:
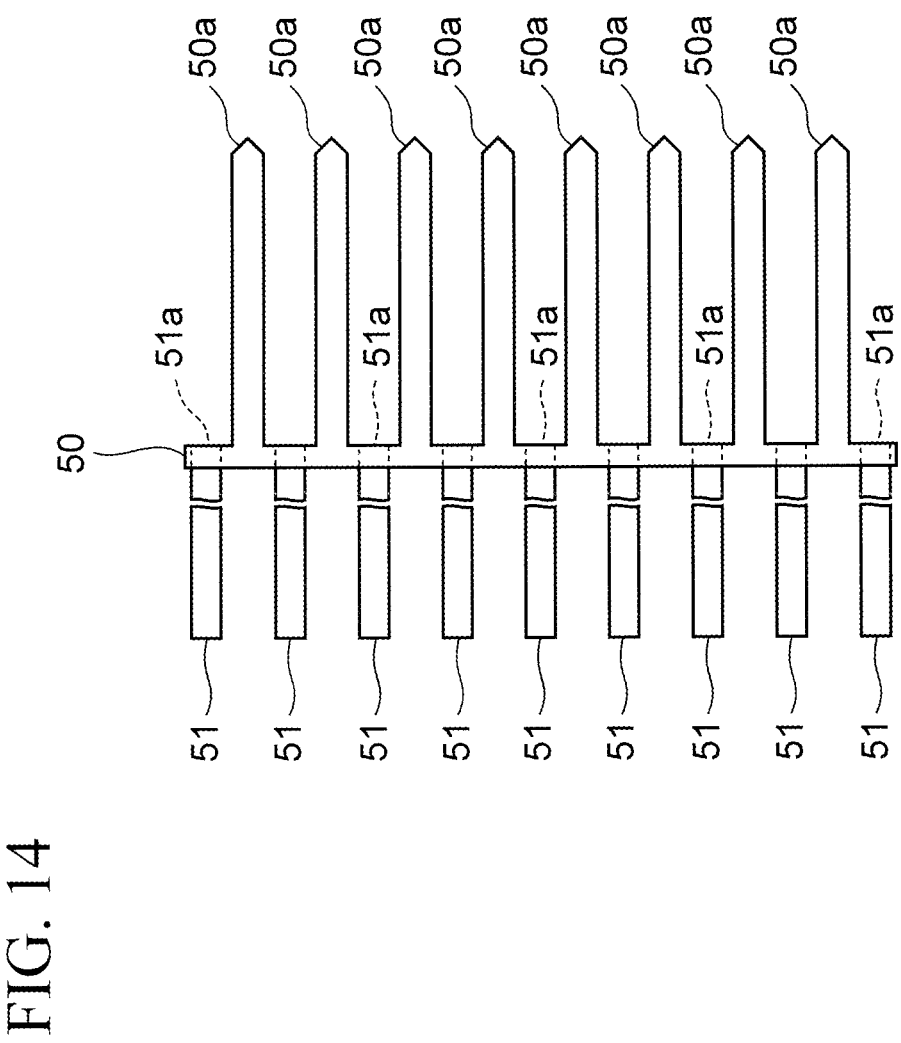
FIG. 14 is a plan view of one of connectors according to the first embodiment.

FIG. 14 is a plan view of one of the connectors 50.

Each connector 50 includes the plurality of optical fibers 51 and the plurality of guide pins 50a, and the end face 51a of an optical fiber 51 is exposed between two adjacent guide pins 50a.

Figure 15:
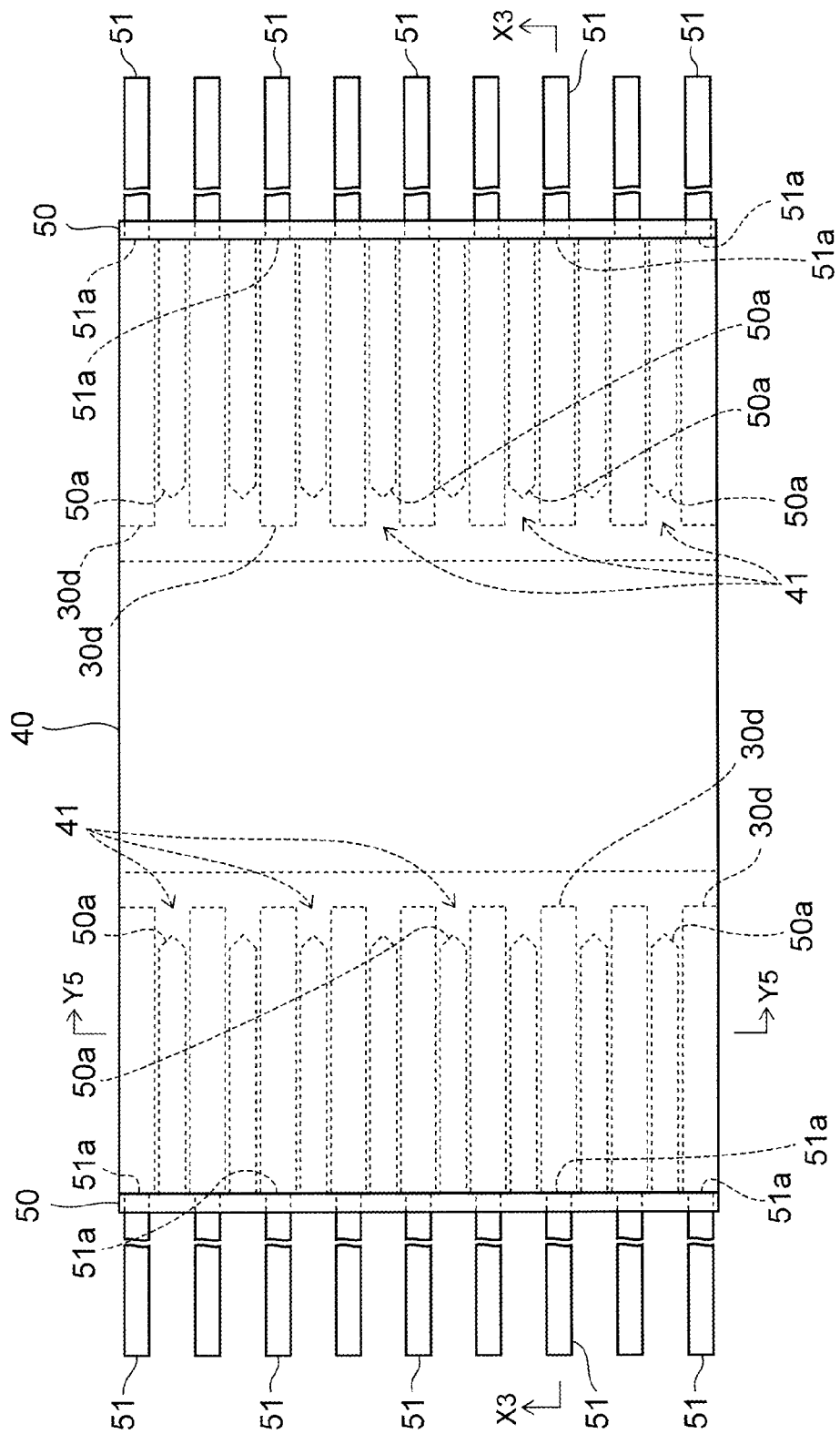
FIG. 15 is a plan view of the optical semiconductor element according to the first embodiment with the connectors mounted to an element body.

FIG. 15 is a plan view of the optical semiconductor element 70 with the connectors 50 mounted to the element body 60.

As illustrated in FIG. 15, the guide pins 50a are inserted in the guide holes 41. Thus, the optical fibers 51 and the first optical waveguides 30d may be accurately aligned with each other.

Figure 16:
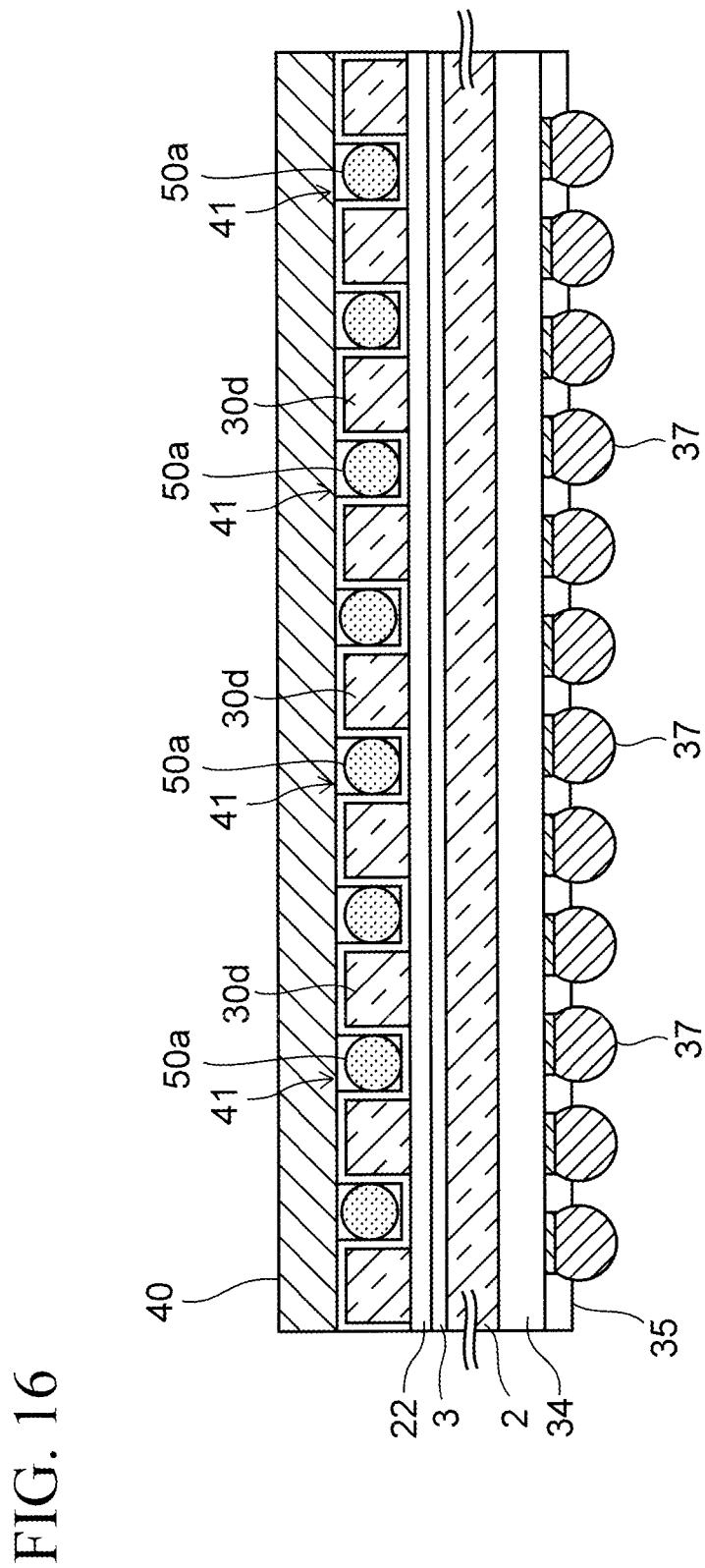
FIG. 16 is a cross-sectional view taken along line Y5-Y5 in FIG. 15.

FIG. 16 is a cross-sectional view taken along line Y5-Y5 in FIG. 15.

As illustrated in FIG. 16, the guide pins 50a have a circular cross-sectional shape of such a size that the guide pins 50a may be fitted in the guide holes 41.

Figure 17:
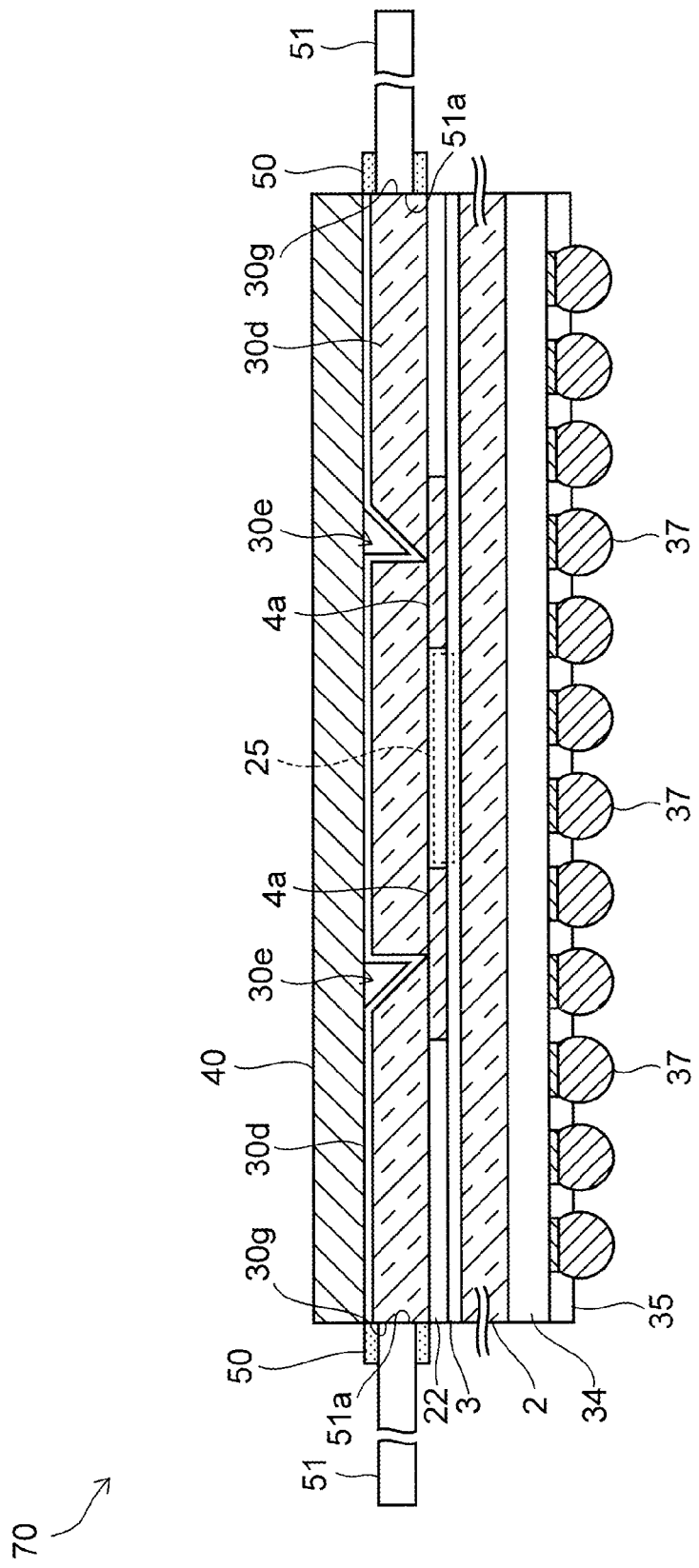
FIG. 17 is a cross-sectional view taken along line X3-X3 in FIG. 15.

FIG. 17 is a cross-sectional view taken along line X3-X3 in FIG. 15.

As a result of improving the alignment accuracy by using the guide pins 50a as described above, the end faces 51a of the optical fibers 51 and end faces 30g of the first optical waveguides 30d will be misaligned less easily. This reduces the loss of optical signals between the optical fibers 51 and the first optical waveguides 30d.

By the above steps, the basic structure of the optical semiconductor element 70 according to this embodiment is completed.

According to the method of manufacturing the optical semiconductor element described above, when the first grooves 30c that will eventually be the guide holes 41 are formed, the first optical waveguides 30d are defined by these first grooves 30c as illustrated in FIG. 7B. Thus, the step of forming the first optical waveguides 30d serves also as a part of the step of forming the guide holes 41. Accordingly, the number of steps may be reduced as compared to a case where the first optical waveguides 30d and the guide holes 41 are formed separately.

Moreover, the mechanical processing using the blades 90, 91 such as dicing saws have higher processing accuracy than etching. Thus, the first grooves 30c and the second grooves 30e may be formed accurately.

Considering particularly that a side face of each second groove 30e serves as the mirror surfaces 30f as illustrated in FIG. 10, forming the side face through the mechanical processing allowing high processing accuracy as described above may make it easier to obtain an angle θ of 45° between the mirror surfaces 30f and the normal line n. As a result, the optical paths C (see FIG. 3) may be bent at a right angle at the mirror surfaces 30f. Accordingly, the loss of optical signals L between the second optical waveguides 4a and the first optical waveguides 30d may be suppressed.

The usage of the optical semiconductor element 70 is not particularly limited.

Figure 18:
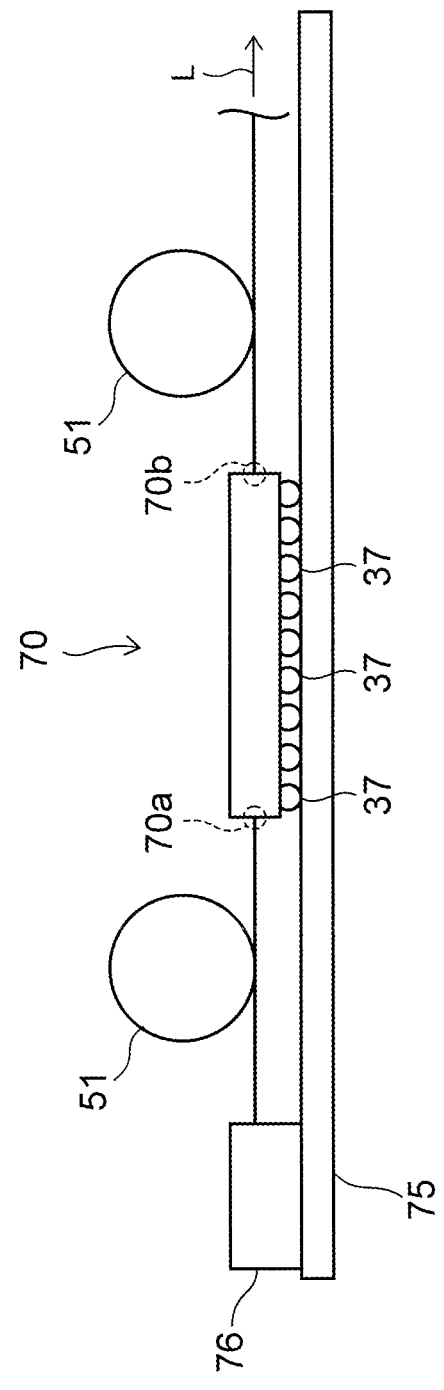
FIG. 18 is a cross-sectional view illustrating an example of the usage of the optical semiconductor element according to the first embodiment.

FIG. 18 is a cross-sectional view illustrating an example of the usage of the optical semiconductor element 70.

In this example, the optical semiconductor element 70 according to this embodiment and laser elements 76 are mounted on a wiring board 75. Moreover, an input side 70a of the optical semiconductor element 70 and the laser elements 76 are connected by the optical fibers 51, and optical fibers are connected also to an output side 70b of the optical semiconductor element 70.

In this way, optical signals L generated in the laser elements 76 may be modulated in the optical semiconductor element 70, and the modulated optical signals L may be supplied to a different electronic device.

Second Embodiment

In this embodiment, an optical semiconductor element capable of preventing connectors from falling from an element body will be described.

Figure 19:
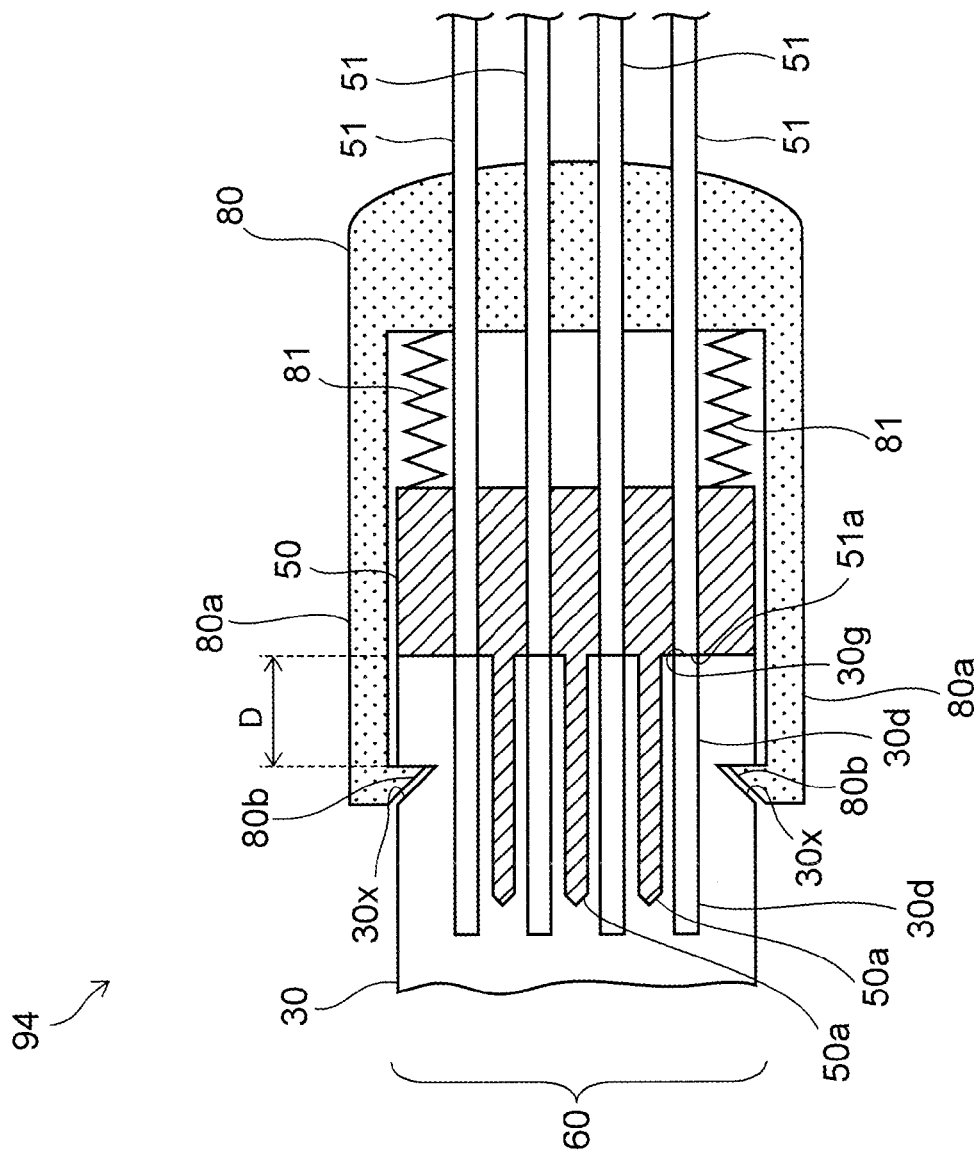
FIG. 19 is a cross-sectional view of an optical semiconductor element according to a second embodiment.

FIG. 19 is a cross-sectional view of the optical semiconductor element according to this embodiment. Note that in FIG. 19, the same components as those described in the first embodiment are denoted by the same reference signs as those in the first embodiment, and their description will be omitted below.

As illustrated in FIG. 19, this optical semiconductor element 94 includes an element body 60 and housings 80.

Each housing 80 accommodates a connector 50 and includes a pair of lock arms 80a. The material of the housing 80 is not particularly limited. In this embodiment, the housing 80 is formed from an elastic resin so that the lock arms 80a may be elastic.

Claws 80b are provided at the tips of the lock arms 80a, and recessed portions 30x which may be fitted to these claws 80b are provided in the outer side faces of a semiconductor substrate 30 of the element body 60. Since the lock arms 80a are elastic as mentioned above, the lock arms 80a are easily deformable. Thus, the claws 80b are attachable to and detachable from the recessed portions 30x.

Moreover, springs are provided inside the housing 80 as biasing members 81. The biasing members 81 are configured to bias the connector 50 in a direction in which a distance D between the claws 80b and the connector 50 decreases. As a result, end faces 51a of the optical fibers are pressed against end faces 30g of first optical waveguides 30d in the element body 60, so that the end faces 30g, 51a come into close contact with each other.

According to this embodiment described above, by fitting the claws 80b of the lock arms 80a into the recessed portions 30x of the element body 60, it may be possible to prevent the connector 50 from falling from the element body 60.

Further, since the biasing members 81 bring the end faces 51a, 30g of the optical fibers 51 and the first optical waveguides 30d into close contact with each other, it may be possible to suppress the occurrence of loss in optical signals between the optical fibers 51 and the first optical waveguides 30d.

Another Embodiment

In the first embodiment, the cladding layer 33 is formed on the first optical waveguides 30d and the mirror surfaces 30f as illustrated in FIG. 3 to thereby keep light inside the first optical waveguides 30d.

Figure 20:
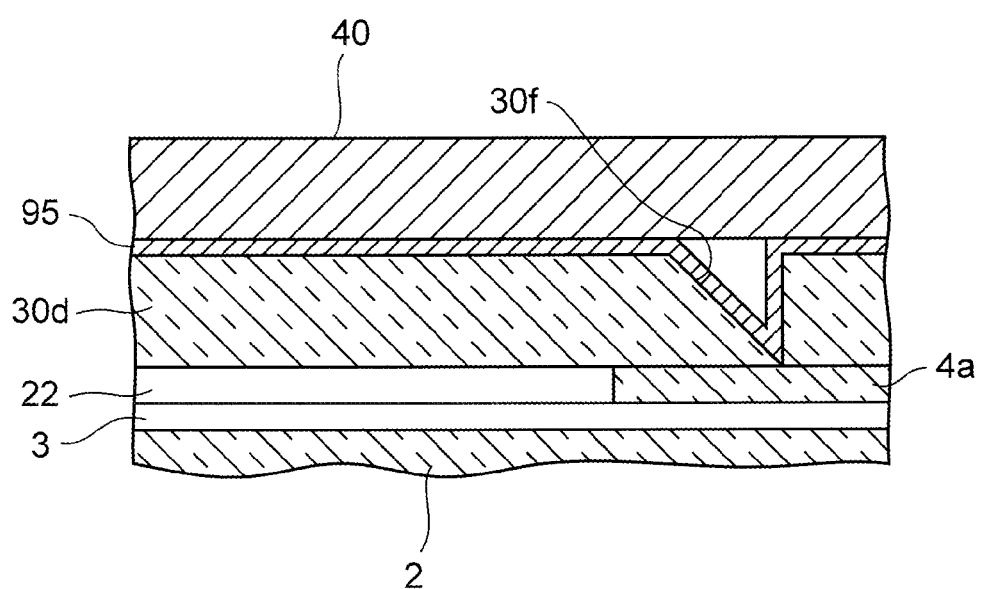
FIG. 20 is an enlarged cross-sectional view of an optical semiconductor element according to another embodiment.

To enhance the reflectance of the mirror surfaces 30f for optical signals, a metal layer 95 may be formed by using a deposition method instead of the cladding layer 33 as illustrated in an enlarged cross-sectional view in FIG. 20. A gold film which has good optical reflectance is preferably formed as this metal layer 95.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An optical semiconductor element, comprising:
   a semiconductor substrate having a first main surface and a second main surface in which a plurality of first grooves are formed;
   a first optical waveguide defined by portions of the semiconductor substrate between the first grooves and having side faces defined by the first grooves; and
   a photoelectric converter configured to transmit or receive an optical signal propagating through the first optical waveguide, wherein
   the first grooves define part of a guide hole, and
   the side faces are perpendicular to the second main surface.

2. The optical semiconductor element according to claim 1, further comprising a heat sink fixed to the second main surface, wherein
   the guide hole is defined by a surface of the heat sink and the first grooves.

3. The optical semiconductor element according to claim 1, further comprising a mirror surface provided at an end of the first optical waveguide and configured to bend an optical path of the optical signal toward the first main surface, wherein
   the photoelectric converter is provided on the first main surface.

4. The optical semiconductor element according to claim 3, further comprising a second optical waveguide provided on the first main surface and coupled to each of the first optical waveguide and the photoelectric converter.

5. The optical semiconductor element according to claim 4, wherein a grating coupler is provided between the first optical waveguide and the second optical waveguide.

6. The optical semiconductor element according to claim 3, wherein the mirror surface is defined by a side face of a second groove formed in the second main surface in such a way as to cross the first grooves.

7. The optical semiconductor element according to claim 3, wherein a metal layer is formed on the mirror surface.

8. The optical semiconductor element according to claim 1, further comprising a connector including an optical fiber and a guide pin, wherein
   the guide pin is inserted in the guide hole, and the optical fiber and the first optical waveguide are optically connected to each other.

9. The optical semiconductor element according to claim 8, further comprising:
   a housing accommodating the connector; and
   a lock arm which is provided to the housing and on which a claw is formed, wherein
   a recessed portion in which to fit the claw is formed in the semiconductor substrate.

10. The optical semiconductor element according to claim 5, further comprising a biasing member provided to the housing and configured to press an end face of the optical fiber against an end face of the first optical waveguide.

11. The optical semiconductor element according to claim 1, wherein a cladding layer is formed on a surface of the first optical waveguide.

12. The optical semiconductor element according to claim 11, wherein the cladding layer is a thermally-oxidized layer formed by thermally oxidizing the semiconductor substrate.

* * * * *